(12) United States Patent
Wahlsten et al.

(10) Patent No.: US 8,934,081 B2
(45) Date of Patent: Jan. 13, 2015

(54) METHOD AND APPARATUS FOR PERFORMING ALIGNMENT USING REFERENCE BOARD

(75) Inventors: Mikael Wahlsten, Stockholm (SE); Raoul Zerne, Råå (SE)

(73) Assignee: Mycronic AB, Taby (SE)

( * ) Notice: Subject to any disclaimer, the term of this patent is extended or adjusted under 35 U.S.C. 154(b) by 652 days.

(21) Appl. No.: 12/929,977

(22) Filed: Feb. 28, 2011

(65) Prior Publication Data

US 2011/0228242 A1 Sep. 22, 2011

Related U.S. Application Data

(60) Provisional application No. 61/282,561, filed on Mar. 1, 2010, provisional application No. 61/282,584, filed on Mar. 3, 2010.

(51) Int. Cl.
*G03B 27/42* (2006.01)
*H05K 3/00* (2006.01)
*G03F 9/00* (2006.01)
*H05K 1/02* (2006.01)

(52) U.S. Cl.
CPC ............ *H05K 3/0008* (2013.01); *H05K 1/0269* (2013.01); *G03F 9/00* (2013.01)
USPC .................................. 355/53; 355/72; 355/77

(58) Field of Classification Search
CPC ............ G03F 7/70775; G03F 7/70116; G03F 9/7088; G03F 7/20; G03F 7/70275; G03F 7/7085; G03F 9/7011; G03F 7/707; G03F 9/70; G03F 9/7019; G03F 9/7084; G03F 7/70683; G03F 9/7015; G03F 9/7069; G03F 9/7076; G03F 7/70383; G03F 7/70866; G03F 9/7046
USPC ............. 355/53, 55, 63, 72, 77; 382/145, 151
See application file for complete search history.

(56) References Cited

U.S. PATENT DOCUMENTS

| | | |
|---|---|---|
| 6,018,384 A | 1/2000 | Ota |
| 2003/0086600 A1 | 5/2003 | Ganot et al. |
| 2005/0213071 A1* | 9/2005 | Fukuda ............................ 355/69 |
| 2005/0213806 A1 | 9/2005 | Hanina et al. |
| 2005/0254032 A1 | 11/2005 | Ozaki et al. |
| 2008/0170239 A1 | 7/2008 | Uemura et al. |
| 2009/0033952 A1 | 2/2009 | Fukui et al. |
| 2009/0035669 A1* | 2/2009 | Uemura et al. .................. 430/22 |

FOREIGN PATENT DOCUMENTS

WO WO-03094582 A2 11/2003

OTHER PUBLICATIONS

International Search Report dated Jun. 30, 2011 for International Application No. PCT/EP2011/052865.

* cited by examiner

*Primary Examiner* — Mesfin T Asfaw
(74) *Attorney, Agent, or Firm* — Harness, Dickey & Pierce, P.L.C.

(57) ABSTRACT

An alignment method for the of patterning a work piece in a direct write machine, wherein a reference board provided with board reference features is used to coordinate calibration of a measurement station and a writing station against a common reference. An adjusted pattern is for writing on the work piece is calculated relative to the position of the reference board.

29 Claims, 17 Drawing Sheets

_US 8,934,081 B2_

METHOD AND APPARATUS FOR PERFORMING ALIGNMENT USING REFERENCE BOARD

CROSS-REFERENCE TO RELATED APPLICATIONS

This non-provisional U.S. patent application claims priority under 35 U.S.C. §119(e) to provisional U.S. patent application No. 61/282,561, filed on Mar. 1, 2010 provisional U.S. patent application No. 61/282,584, filed on Mar. 3, 2010, the entire contents of all of which are incorporated herein by reference.

TECHNICAL FIELD OF THE INVENTION

The present invention relates in general to patterning a photosensitive surface on workpieces. More particularly, the present invention relates to methods and devices for calibration of apparatus for patterning by pattern imaging of a photosensitive surface.

GENERAL BACKGROUND OF THE INVENTION

General Description of Pattern Generation

It is common practice to generate patterns on photosensitive surfaces or layer on workpieces by means of pattern generators such as laser direct writers and mask writers. Different kinds of patterns for different applications are generated in this manner, for example patterns on workpieces in the form of substrates for manufacturing printed circuit boards, patterns on workpieces for manufacturing displays or patterns on workpieces for manufacturing a photomask.

In the example of manufacturing printed circuit boards an electric circuit pattern is generated in order to couple connection points or contact pads of components such as dies in a desired electric circuit. The expression die is herein used as common expression for any electronic component such as a passive component, an active component, or any other component associated with electronics.

Such a pattern is generated in a photolithography process in which an image of a circuit pattern is projected or printed on a photosensitive surface layer by an exposure system exposing light onto the photosensitive surface in a certain pattern. Dependent on the used kind of photosensitive surface material, unexposed or exposed parts of the photosensitive surface layer are removed to form etching masks on the workpiece. The masked workpiece is then etched to form the desired pattern on a layer beneath the photosensitive surface. A variation of this concept is to use the pattern on the photosensitive surface to deposit material onto the underlying layer, e.g. to form an electrical circuit pattern or connection points on the workpiece in the case of printed circuit boards.

Pattern Generator

The pattern generator is, as mentioned above, for example realized by means of a laser direct imaging (LDI) system devised for writing a pattern on the photosensitive surface by means of a laser scanning the surface with a laser beam that is modulated according to image pattern data and forming an image representing a desired pattern. Another kind of pattern generator is a mask writer or a stepper. Commonly, a pattern is designed as an image in a CAD system and control of the pattern generator is based on image pattern data.

SPECIFIC BACKGROUND OF THE INVENTION

In pattern generating processes one factor that affects the productivity is the need to calibrate the equipment in order to make a good alignment of a designed pattern to the actual circumstances of the workpiece.

Alignment and Calibration

Generally, the designed pattern must be aligned to certain characteristic features of the workpiece. For example in the manufacturing of printed circuit boards, the designed pattern must be aligned to the dies in order to fit to connection points in the functional electronic circuit of the respective die or to other patterns in the same or different layers of the workpiece.

In prior art, measuring systems comprising imagers e.g. CCD cameras, are commonly used in such alignment procedures for determining the position of a workpiece and selected features on the workpiece. For example, the cameras are employed to detect features of the workpiece such as edges or markings on the workpiece, the positions of the features in the images are used to calculate the real physical positions in relation to a reference in the pattern generator.

There are different ways to compensate for the deviations of the real physical conditions from the ideal physical conditions upon which the originally designed image pattern data is assumed. For example, the image pattern data is adjusted and the pattern is then written dependent on the adjusted image pattern data. In another example, the coordinate system of the writer is adjusted to compensate and the original pattern data is written in an adjusted coordinate system.

In any case, it is necessary to calibrate the measuring system (or measurement station) and the writer control system in order to achieve alignment and pattern generation that fulfil accuracy requirements of the generated pattern.

PRIOR ART

Examples of prior art pattern generators and calibration of such apparatus are found in the patent publications:
US 2005/0254032 Exposure Device.
US 2003/0086600 Multilayer Printed Circuit Board Fabrication System and Method;
WO 03/094582 and related US2005/0213806 (A1) A System and Method for Manufacturing Printed Circuit Boards Employing Non-uniformly Modified Images.

These pieces of prior art describe the general functionality of pattern generators in the form of laser direct imaging systems adapted to write an electric circuit pattern on a printed circuit board dependent on pattern image data. These publications further describe prior art for alignment of patterns on substrates.

The prior art document US 2003/0086600, for example, describes a general prior art setup of such a pattern generator in the shape of a scanning laser direct imaging (LDI) system for writing pattern on a workpiece such as a substrate. The LDI system thus comprises a table with a carrier stage (FIG. 3, reference number 79), also called base, devised for carrying a substrate. The carrier stage/base is arranged to move on a track past cameras in a measurement system and past a laser scanner in a writer station. In operation, a substrate is placed on the carrier stage/base and then moves with the carrier stage during the various operations of the patterning that takes place in the LDI system.

Problem

The general object of the invention is to improve the calibration of pattern imaging apparatus. A more specific problem to be solved by the present invention is to improve the calibration process with regard to alignment of patterns.

SUMMARY OF THE INVENTION

The object is achieved and the problem is solved by providing a method and/or an apparatus and/or a computer program product according to the appended claims.

The problem is solved by providing a reference board on a carrier stage for carrying a workpiece in the patterning process. The reference board is used in different steps to determine the position of the workpiece in relation to the reference board, and/or to determine a measurement system in relation to the reference board and/or a writer system in relation to the carrier board. The reference board is according to one aspect used to enable alignment based on a reference that is fixed in relation to the workpiece. According to another aspect the invention also enables the calibration of the measurement system and the writing system to a common reference. Thereby the invention allows for an increase in accuracy and productivity in pattern generation.

The invention is applicable to pattern imaging of workpieces in the manufacturing of products comprising the patterning of a photosensitive surface for different types of pattern imaging apparatus, called write machines, for example a laser direct imaging device, a mask writer or a stepper.

Examples of such products are printed circuit boards PCB, substrates, flexible roll substrate, flexible displays, wafer level packages WLP, flexible electronics, solar panels and displays. The invention is directed to patterning such a photosensitive surface on a workpiece for such products, where a workpiece can be any carrier of a surface layer upon which a pattern can be printed with a laser direct imaging system.

BRIEF DESCRIPTION OF DRAWINGS

The invention will be further explained with reference to the accompanying drawings wherein.

EXPLANATIONS OF TERMINOLOGY AND EMBODIMENTS USED IN THIS TEXT

Workpiece

Figure 1:
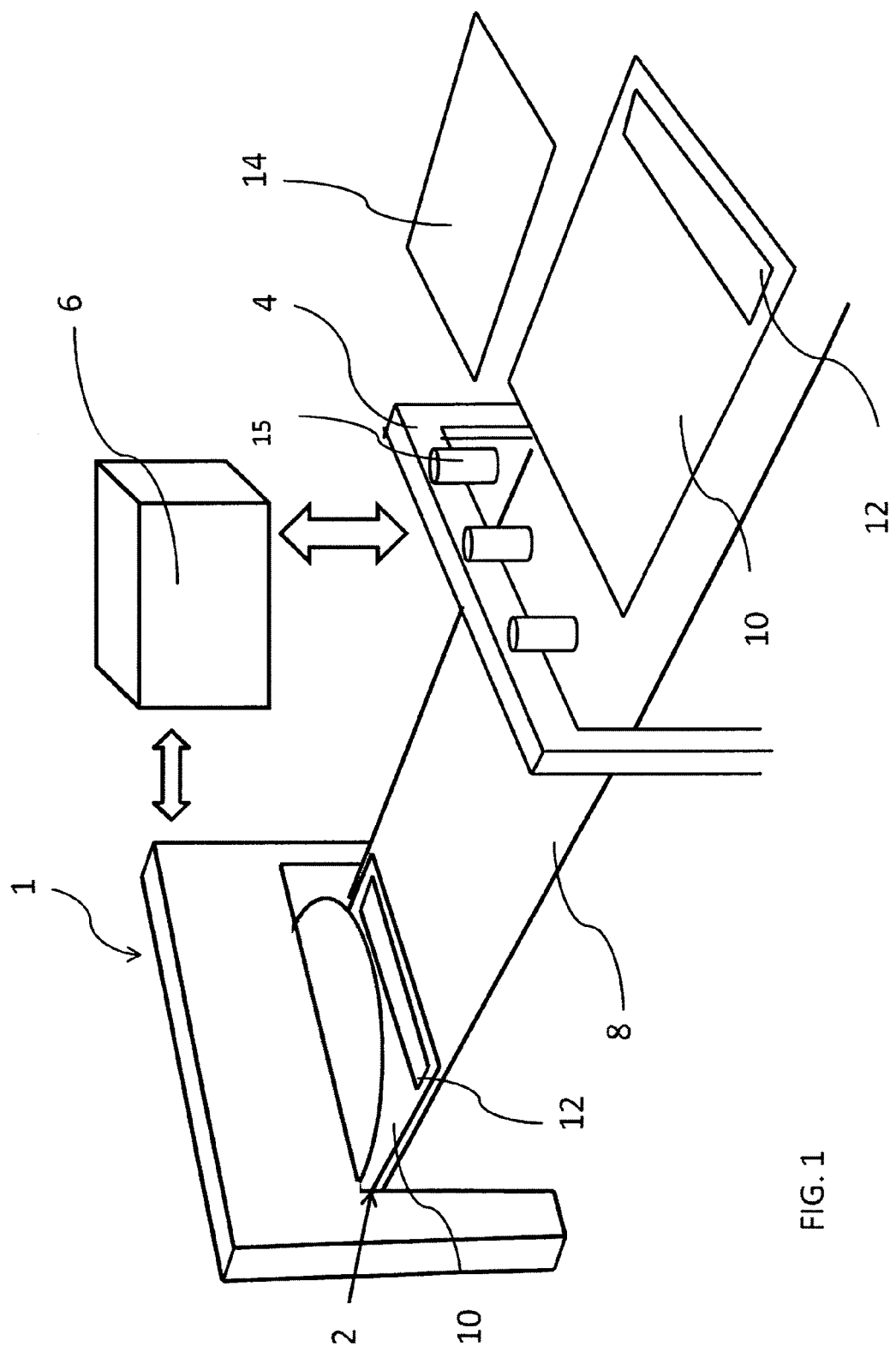
FIG. 1 shows schematically a write machine and measurement station setup according to an embodiment of the invention.

For the purpose of this application text the term workpiece is used to denominate any carrier of a surface layer upon which a pattern can be printed with a laser direct imaging system. For example a silicon substrate or a silicon wafer for a printed circuit board workpiece. Workpieces may any shape, such as circular, rectangular or polygonal, and any size in a piece or in a roll.

Die

For the purpose of this application text the term die is used to denominate a passive component, an active component, or any other component associated with electronics. For example, a die may be a small block of semiconducting material, on which a given functional circuit is fabricated.

Local Alignment

For the purpose of this application text the term local alignment is used to denominate alignment in relation to alignment features, for example alignment marks, on an individual die.

Global Alignment

For the purpose of this application text the term global alignment is used to denominate alignment in relation to alignment features, for example alignment marks, on a workpiece.

Carrier Stage

For the purpose of this text, the term carrier stage is used to denominate a mechanical device that is provided to carry a workpiece during at least a part of the patterning process. The carrier stage is typically provided with a section for placement of a workpiece thereon. The workpiece section may be a flat space for placement of flat workpieces, or be otherwise formed to suit placement of current workpieces. The placement of the workpiece may be such that the workpiece is resting on the carrier stage or is fastened by a fastening device. The carrier stage is typically provided with a mechanical interface for coupling with a track mechanism to move the carrier stage along a track in a writer machine.

Various Explanations

In the drawings, the thicknesses of layers and regions are exaggerated for clarity. Like numbers refer to like elements throughout the description of the figures.

Detailed illustrative embodiments are disclosed herein. However, specific structural and functional details disclosed herein are merely representative for purposes of describing example embodiments. Example embodiments may be embodied in many alternate forms and should not be construed as limited to only the example embodiments set forth herein. It should be understood, however, that there is no intent to limit example embodiments to the particular ones disclosed, but on the contrary example embodiments are to cover all modifications, equivalents, and alternatives falling within the appropriate scope.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to scanning of workpieces, such as a substrate or wafer, for reading and writing patterns and/or images. Example embodiments also relate to measuring workpieces. Example substrates or wafers include flat panel displays, printed circuit boards (PCBs), flexible printed circuit boards (FPBs), flexible electronics, printed electronics, substrates or workpieces for packaging applications, photovoltaic panels, and the like.

According to example embodiments, reading and writing are to be understood in a broad sense. For example, reading operations may include microscopy, inspection, metrology, spectroscopy, interferometry, scatterometry, etc. of a relatively small or relatively large workpiece. Writing may include exposing a photoresist or other photosensitive material, annealing by optical heating, ablating, creating any other change to the surface by an optical beam, etc.

Conventionally, when alignment marks are measured in a different coordinate system and/or different actual physical position than the position where the actual writing is performed, the coordinate systems must be a calibrated using the same reference.

Further, conventionally, a measured alignment map may be applied when writing in several ways. One example is mechanical repositioning. However, mechanical repositioning creates problems if rapid changes occur in the alignment transform. This may occur if the panel is divided into different alignment regions. Limits in the mechanics may also limit the best possible fit to the measured transform.

DETAILED DESCRIPTION OF EMBODIMENTS

The invention is embodied in methods and apparatus for patterning a workpiece. Specifically, the invention is embodied for alignment and calibration.

The problem is solved by providing a reference board on a carrier stage for carrying a workpiece in the patterning process. The reference board is used in different steps to determine the position of the workpiece in relation to the reference board, and/or to determine a measurement system in relation to the reference board and/or a writer system in relation to the carrier board. The reference board is according to one aspect used to enable alignment based on a reference that is fixed in relation to the workpiece. According to another aspect the invention also enables the calibration of the measurement system and the writing system to a common reference. Thereby the invention allows for an increase in accuracy and productivity in pattern generation.

The invention is applicable to pattern imaging of workpieces in the manufacturing of products comprising the patterning of a photosensitive surface for different types of pattern imaging apparatus, called write machines, for example a laser direct imaging device, a mask writer or a stepper.

Examples of such products are printed circuit boards PCB, substrates, flexible roll substrate, flexible displays, wafer level packages WLP, flexible electronics, solar panels and displays. The invention is directed to patterning such a photosensitive surface on a workpiece for such products, where a workpiece can be any carrier of a surface layer upon which a pattern can be printed with a laser direct imaging system.

Before writing a pattern on a workpiece, a designed pattern is aligned with the workpiece in order to compensate for the actual characteristics of the workpiece. The write machine comprises a pattern writing stations and is communicatively coupled to a measurement station. A computer system is devised to receiving measurement data from the measurement station, to perform operations on a designed pattern and to control the operation of the write machine.

The measurement station is provided with a measurement coordinate system and a camera set that comprises one or more cameras configured to capture measurement images of objects on a carrier stage. The carrier stage is devised for carrying a workpiece typically provided with reference features that are usable for alignment purposes. The carrier stage is displaceable between the measurement station and the writing station, and under operation there is a workpiece placed on the carrier stage. The pattern writing station of the write machine is provided with or is associated with a coordinate system for controlling write operations.

In a method, according to an aspect of the inventive concept, patterning a layer of a workpiece is performed in a write machine, where the write machine comprises a pattern writing station provided with a write machine coordinate system, and a measurement station provided with a measurement coordinate system. The measurement station is configured to perform measurements of objects on a workpiece provided with or associated with reference features, where the workpiece is further placed on a carrier stage and where the write machine is configured to displace the carrier stage between the measurement station and the writing station. A reference board is provided and attached to the carrier stage, the reference board having board reference features on predetermined nominal positions. A measuring operation is performed at least once, in the measurement station, for measuring the position, e.g. location and orientation, of at least one of the reference features of the workpiece relative the reference board. A transformation is calculated dependent on both the measured reference position(s) and on the nominal position(s) of the reference feature(s) of the workpiece, the transformation describing the deviation of the measured positions from the nominal position(s). Thereafter, the carrier stage with the reference board is displaced from the measurement station to the writing station. In the writing station, a pattern is written on the workpiece by adjusting for the transformation describing the deviation of the measured position(s) from the nominal position(s).

The invention is further employed in a system of apparatus and a computer program product configured to perform the steps of the method, as well as in a carrying stage being provided with a reference board.

Operating Environment of the Invention

The invention is typically employed in equipment for pattern imaging, for example laser direct writers, photomask writers and other image pattern writers. For example a scanning laser direct imaging (LDI) system comprising for example a laser direct writer as described in the above mentioned prior art publication US 2003/0086600, which is hereby incorporated by reference for the purpose of enablement.

In such a system a laser beam is scanned over a photosensitive surface layer of a workpiece to expose the layer with a pattern in accordance with pattern image data. The system comprises a computer adapted to control the laser beam scanning dependent inter alia on image pattern data. The system further comprises or is coupled to a computerized measuring system, typically having CCD cameras and recognition software devised to recognize objects such as dies or features such as alignment marks on a workpiece. Measurement data from the measuring system is used in an alignment system to adapt original image pattern data in order to compensate for deviations in the workpiece from assumed conditions. When implementing the invention a computer is provided with specifically designed computer programs adapted to perform steps of the inventive method.

The invention is devised to operate on a workpiece. The workpiece is typically provided with or associated with characteristic features such as alignment marks, and may as in some applications be provided with dies distributed and placed with an arbitrary position on the workpiece. The positions of the reference features and of the dies, if applicable, are defined in a three-dimensional coordinate system and thus indicate location and orientation. In one example, the workpiece has a shape and therefore positions of characteristic features that deviate from the ideal circumstances assumed in the design of the pattern. In another example with dies placed on the workpiece, the dies may have been placed on the workpiece by means of a pick-and-place machine with low position accuracy of the dies. The characteristic features and/or the dies shall typically be aligned with a circuit pattern to be printed on a surface layer, for example such that the circuit pattern can be connected to connection points of the dies. This may for example be applied in a fan-out process. Examplifying embodiments are implemented in or in conjunction with a direct write machine and alignment system.

EXAMPLIFYING EMBODIMENTS OF THE INVENTION

FIG. 1 shows schematically an example of a pattern generating tool comprising a reference board applied in a write machine and measurement station setup according to an embodiment of the invention.

Referring to FIG. 1, the invention is applied in a writing system 1 and an alignment system comprising a measurement station 4 and a reference board 12 mounted on a workpiece carrier stage 10. The alignment system thus includes a measurement station 4 with a camera bridge on which, in this example, a plurality of camera systems 15 are mounted, and a reference board 12 mounted on each of a plurality of workpiece carrier stages 10. There may be one or a plurality of cameras comprised in the measurement station. The carrier stages 10 move between measurement station 4 of the alignment system and the writing system. A computer 6 is operatively and/or communicatively coupled to the measurement station 4 of the alignment system and the writer system 1. In operation, typically a plurality of carrier stages are used to carry separate workpieces for patterning. In FIG. 1 one carrier stage 10 with a workpiece placed thereon is shown in writing position in the writing station. Another carrier 10 is shown in front of the measurement station, and a workpiece 14 is shown at the side intended to be placed on the second carrier 10. The carrier stages are displaceable on a carrier stage track 8 between a measurement position in the measurement station 4 and a writing station in the writer 1.

As shown in FIG. 1, a reference board 12 is attached to each carrier stage 10. The reference board 12 may for example be composed of a temperature stable material such as QZ (quartz). The reference board 12 carries information between the measurement station coordinate system of the alignment system and the writer coordinate system.

The reference board 12 is preferably attached to the carrier stage in such a manner that the reference board is fixed to the carrier stage. For example, as in one embodiment, the reference board is fastened or joined to the carrier stage by bolts or screws. Preferably, a joint would be arranged in combination with a flexural joint mechanism to compensate for tensions for example due to temperature changes. In another embodiment, the reference board is glued to carrier stage.

In a more general sense, the inventive concept is in one embodiment implemented associating the reference features with the carrier stage by integrating the reference features directly with the carrier stage. All varieties and embodiments of the reference board and/or the reference features described herein is combinable or applicable also in this embodiment.

At least one example embodiment provides a method for calibrating the alignment system. According to at least one example embodiment, the scale error, distortion error for each camera is calculated. This may be performed at a grid pattern on the reference board. The pattern may be any pattern for which different positions in the field of view for the camera may be calculated.

In an embodiment described in a general wording, a pattern generating tool according to invention comprises a reference board attached or fixed to a stage, the reference board being configured to carry alignment information between the alignment system and a writing tool. One or more cameras are mounted on a camera bridge, and the one or more cameras are configured to measure positions of alignment marks on a substrate relative to the reference board, the substrate being attached or fixed to the stage. A writing system is configured to expose the substrate. A computer is operatively coupled to the alignment system and writer system.

An embodiment of an alignment method in accordance with the invention comprises the steps of:
1. measuring positions of a plurality of cameras relative to a reference board arranged on a stage;
2. measuring positions of a plurality of alignment marks on a substrate arranged on the stage;
3. calculating an alignment distortion map for the substrate;
4. measuring the position of the reference board using exposure light from a writing tool; and
5. exposing the substrate if a deviation of the measured position of the reference board is acceptable.

Further, if the deviation of the measured position of the calibration is not acceptable, the alignment distortion map is redistributed. The method may comprise placing an image according to an offset in a given direction. Optionally, the alignment distortion map is calculated based on a previous exposure light measurement of the reference board and a lens telecentricity map.

Another embodiment of an alignment method comprises:
1. measuring positions of a plurality of cameras configured to measure alignment marks on a substrate;
2. calculating a lens telecentricity map;
3. measuring alignment marks on the substrate;
4. measuring a thickness of the substrate;
5. measuring a position of a reference board attached to a stage using exposure light;
6. calculating an alignment distortion map based on the lens telecentricity map and the measured position of the reference board; and
7. exposing the substrate taking into account the alignment distortion map.

A further embodiment of an alignment method comprises:
1. measuring positions of a plurality of cameras relative to a reference board attached to a stage;
2. measuring alignment marks on a substrate attached to the stage;
3. measuring and mapping thicknesses of the substrate;
4. measuring a position of a reference board attached to a stage using exposure light;
5. calculating an alignment distortion map based on at least a lens telecentricity map and the measured position of the reference board; and
6. exposing the substrate taking into account the alignment distortion map.

Reference Board

Figure 2:
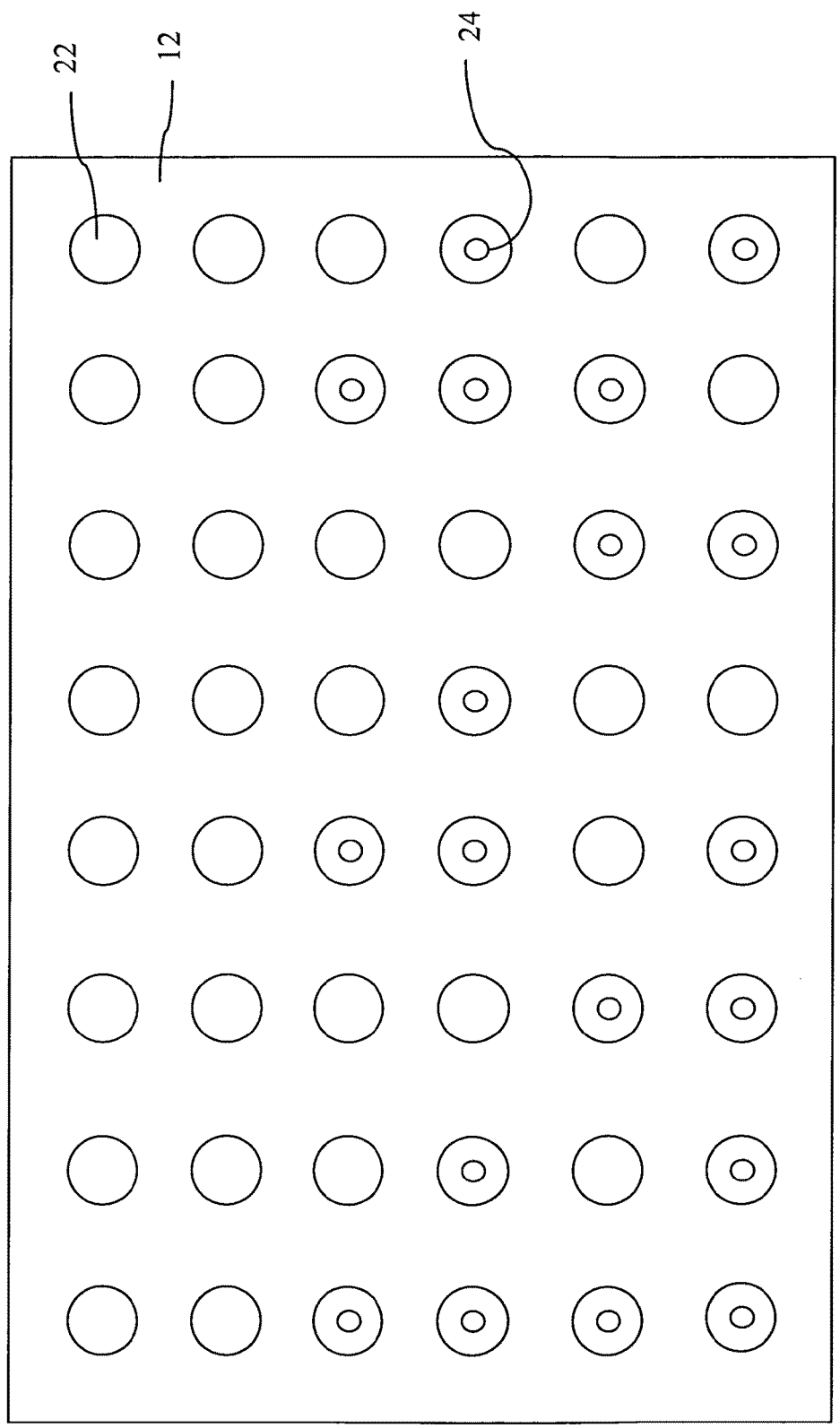
FIG. 2 shows schematically an exemplifying embodiment of a grid pattern on a reference board according to the invention.

FIG. 2 shows an example of a grid pattern on a reference board 12 comprising marks constituting board reference features 22,24 including circles in the form of filled circles 22 and annular ring shaped circles 24. The positions of the marks are either known from a sufficiently accurate measurement machine or written by equipment such that the marks are assumed to be ideal. In one example application of the invention, the positions of the marks are measured, and the measured positions of the marks are compared to nominal positions to create a compensation map. The compensation map addresses the residual error and is used in the alignment process to create an adjusted pattern.

Example of Distortion Map

Figure 3:
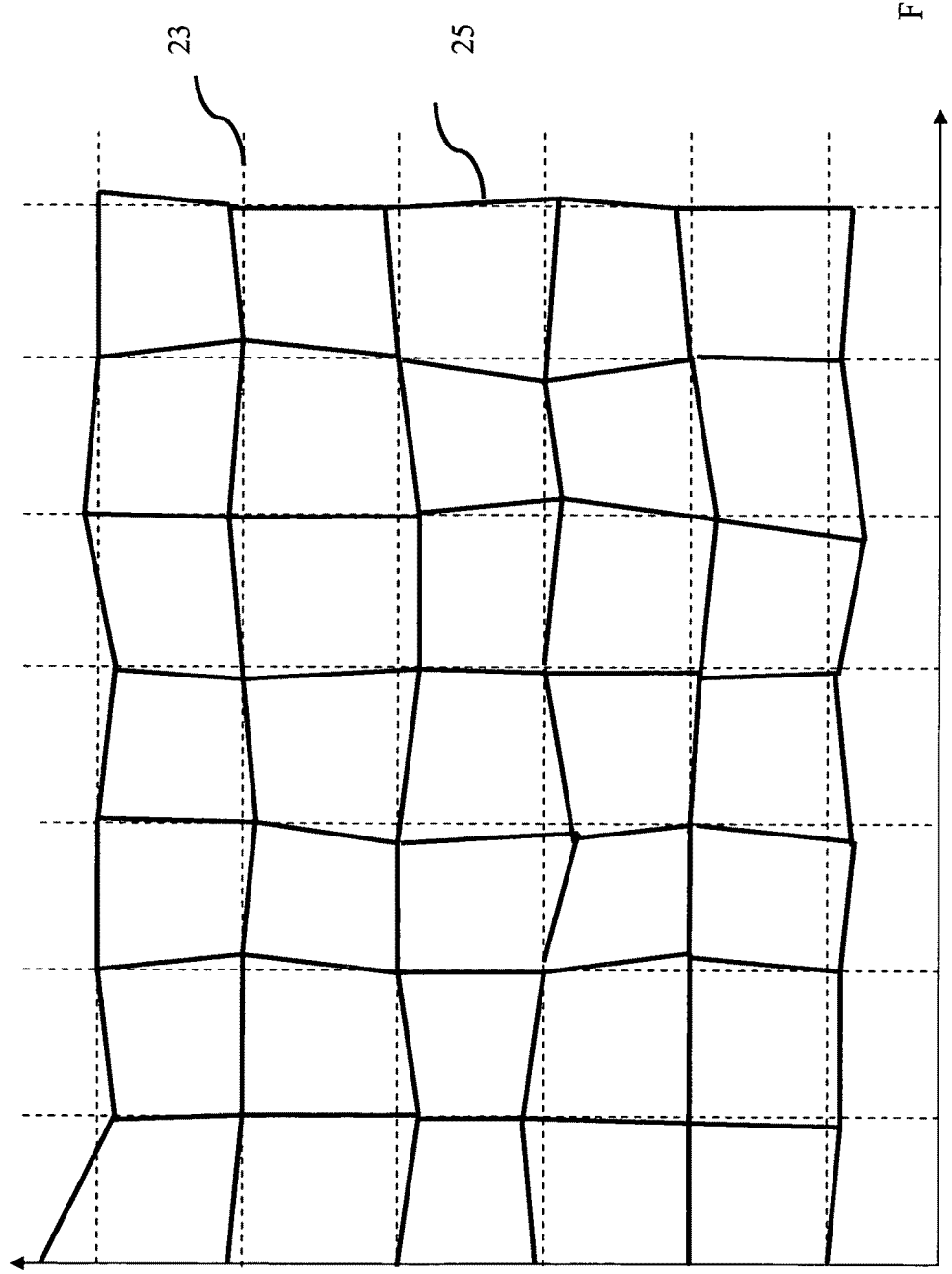
FIG. 3 illustrates an example distortion map.

FIG. 3 illustrates an example distortion map with the scale removed. The distortion map may be used to create a compensation map to compensate for residual error, The scale may be a global parameter or part of a lens distortion map. The distortion map is generated based on a measurement of the reference board. In FIG. 3 a distortion grid 25 indicating the measured positions on the reference board is superimposed over an ideal positions grid 27.

In one exemplifying embodiment, this measurement is performed at two or more different heights (e.g., either on different reference boards or a reference board that has an adjustable z-height) in a first step of calibrating. The scale and distortion map for heights between the measured heights is interpolated (e.g., linearly or other). The position change as function of z is measured and a landing angle for each camera is calculated and stored. This landing angle may be absolute or relative to the landing angle of the writing system.

Camera System of Measurement Station
[<Från US Provisional Med Bearbetning]

Figure 4:
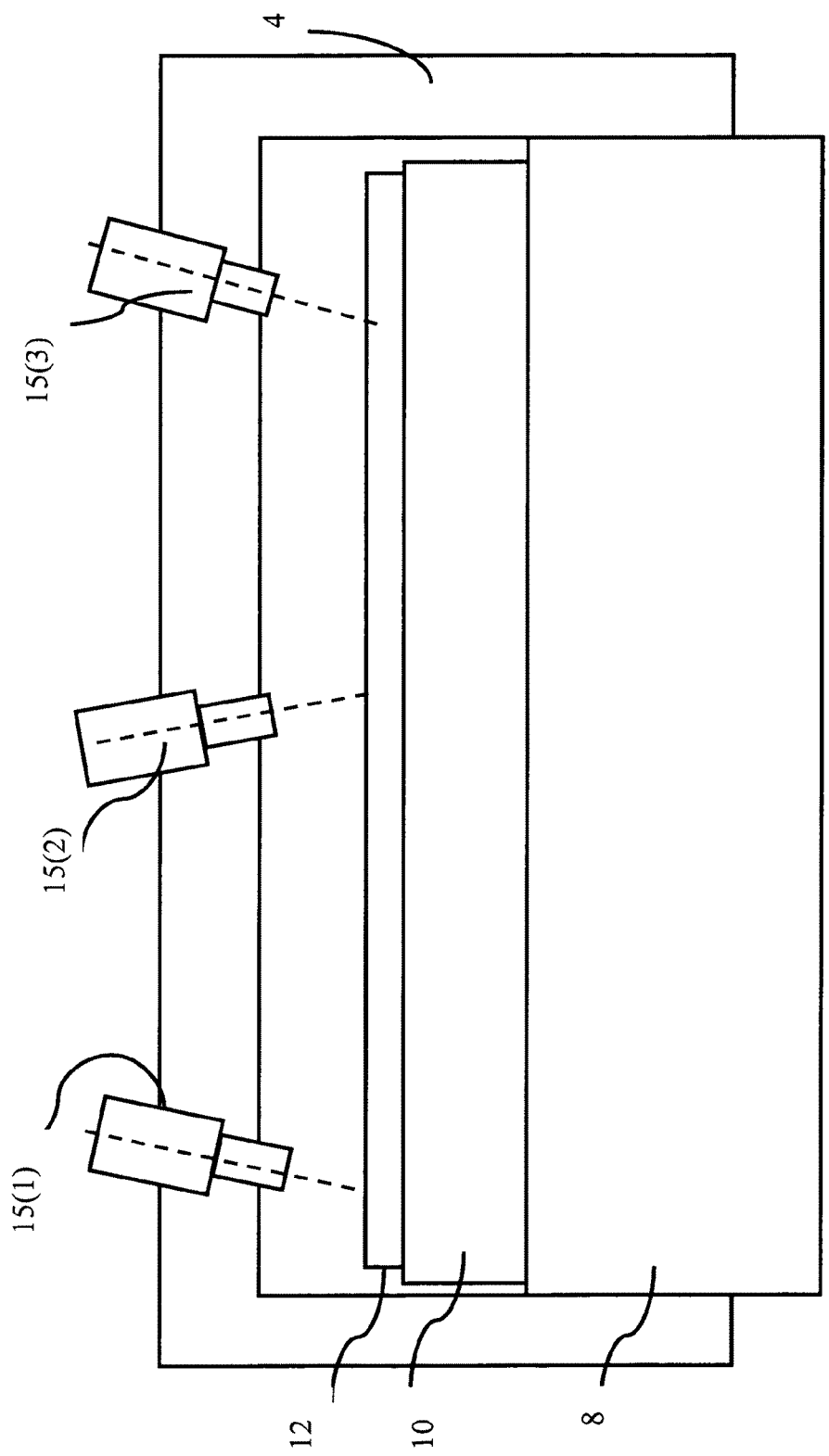
FIG. 4 illustrates a different landing angle for each camera and the landing angle of exposure light of the writing system.

FIG. 4 illustrates a different landing angle for each camera 15(1),15(2),15(3) and the landing angle of exposure light of the writing system. In FIG. 4 the measurement station 4 is shown in a side view with a carrier stage 10 provided with a reference board 12 is located in a measurement station on a carrier stage path 8.

In a second step of calibrating the alignment system, the camera's position and rotation is measured relative to the reference board 12. The reference board has a pattern that is connected to or associated with an absolute position relative to some point on the reference board. In one example, the pattern has a constant pitch and the mark number gives the total distance. In another example, the pattern holds information of global position, such as a different pitch, which is a function of position or some other coding. The rotation of the camera is calculated as the rotation between the pattern and the coordinate system connected to the camera.

Examples of Patterns on Reference Board

Figure 5:
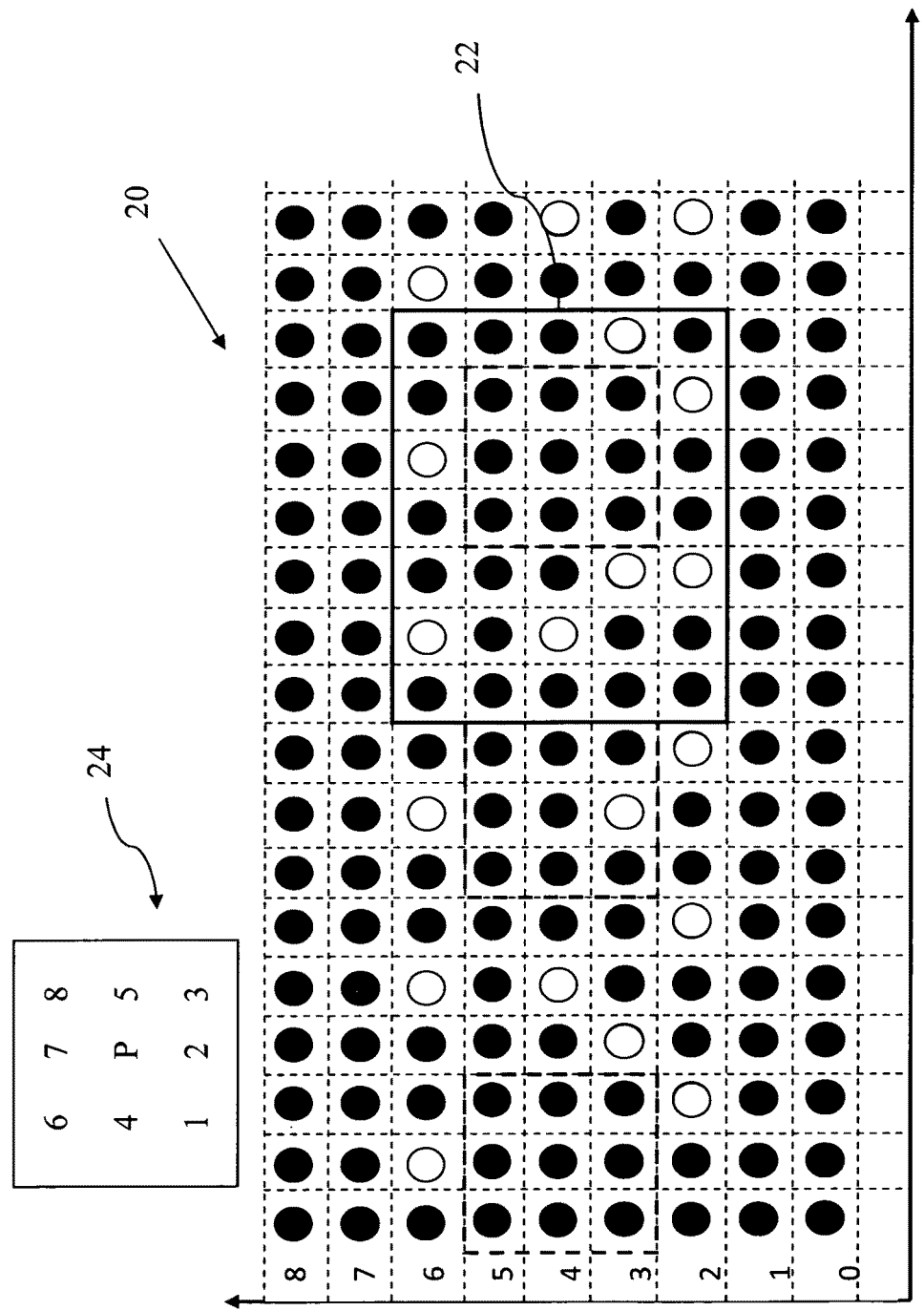
FIG. 5 shows an example pattern of board reference features on an embodiment of a reference board.

FIG. 5 shows an example pattern of board reference features on an embodiment of a reference board 20, the pattern including 3×3 cells 24 with a binary coding with the bit number. In this example, 8 bits are used, which gives 256 unique cell numbers and the centrum bit is used for parity check.

Figure 6:
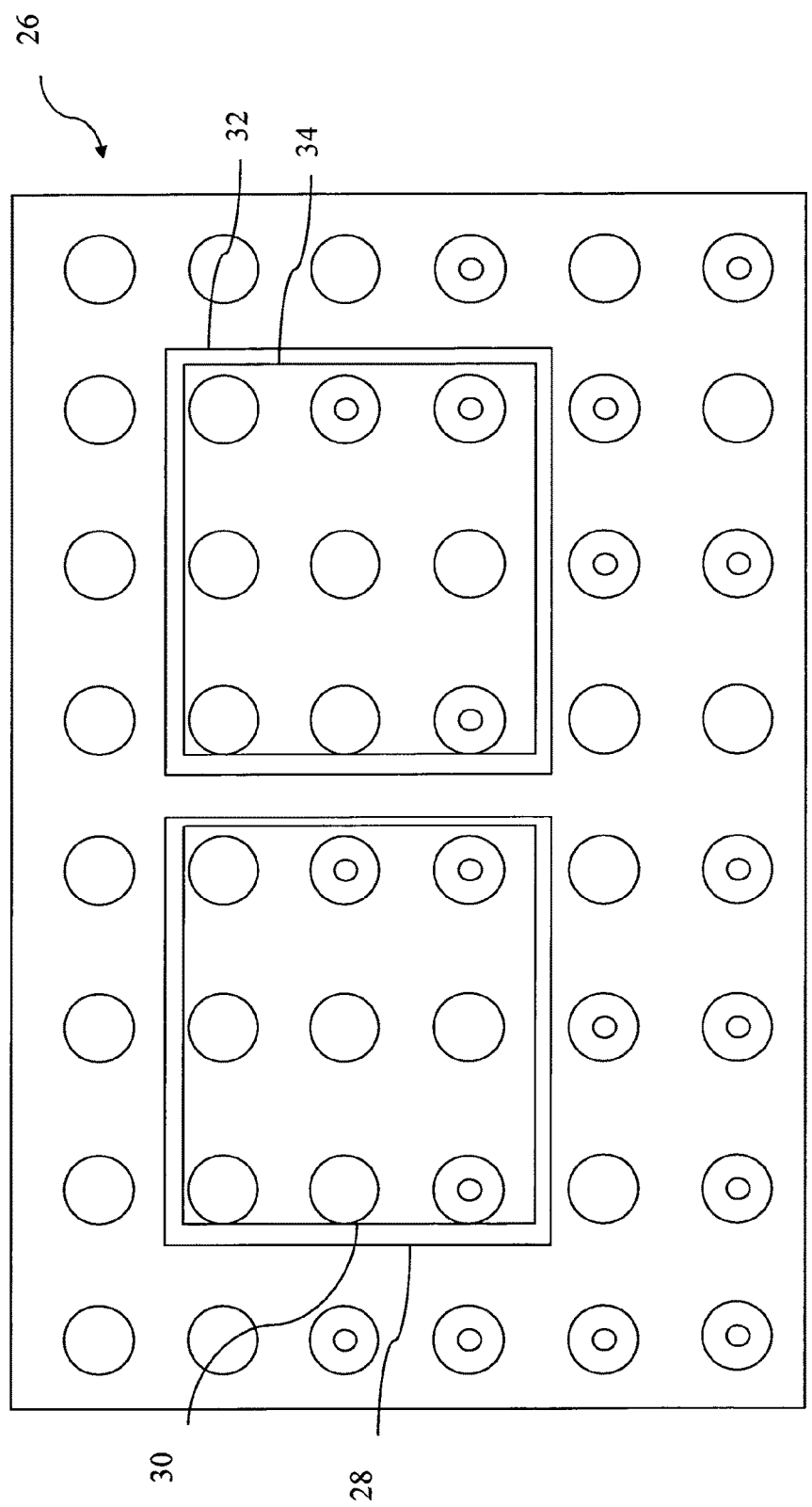
FIG. 6 shows an example image of a pattern portion.

FIG. 6 shows an example image of a pattern portion 26 comprising two 3×3 cells 30,34 of a reference board. The pattern portion 26 corresponds to the pattern portion 22 in FIG. 5. As seen in FIG. 5 and FIG. 6, the coding of the global position is a given pitch PITCH multiplied by a number MARKNUMBER given by the binary code in the image. For example, the coding of the global positions POSITION is given by Equation (1):

$$POSITION = PITCH * MARKNUMBER \quad (1)$$

Measuring Position of Camera

The position of the camera may be any given coordinate relative to the position of the mark of the board reference features on the reference board. In one method, the centre of the camera is defined relative to the position of the board reference feature mark. If several board reference feature marks are visible in the field of view of the camera, the mean of the positions may be used.

The stage area at the alignment position is either made with sufficient mechanical accuracy to be assumed ideal or must be calibrated. If the stage area needs to be calibrated, the stage area is calibrated by using the reference board which is in the form of a rigid reference plate (e.g., a QZ plate) on the stage. As described above, the reference board in the form of a reference plate has measurement marks at known positions. The cameras measure the positions of the marks and compare the measured positions with nominal positions. Given a specific reference surface, the error due to different landing angles of the cameras may be compensated. Or, only relative changes in each row/column may be compensated. In one example, the mean error is removed. The difference from nominal mark positions specifies a compensation map for the stage area. The stage map is either connected to the reference board by measuring the reference marks relative the reference board (e.g., camera measure first on reference board and then on reference plate), or by adding the stage map relative to the reference board assuming a negligible distance between the reference plate and the reference board or using extrapolation. At the writer position, the stage is calibrated with the same reference plate, but the measurement is performed with a write beam or an optical system that is calibrated to the write beam.

Measuring Alignment Marks

In a method for measuring alignment marks, the reference board is measured with cameras, and the alignment marks on the panel/substrates are measured relative the reference board. A transformation is calculated based on the measured positions and the nominal positions. The transformation may be global to the whole panel, a local area, or an area local to each substrate depending on how many alignment marks are available. The applied transformation (e.g., local or global)

may be of any type (e.g., rotation+translation+scale, affine, projective or other non linear transformation).

Figures 7A, 7B:
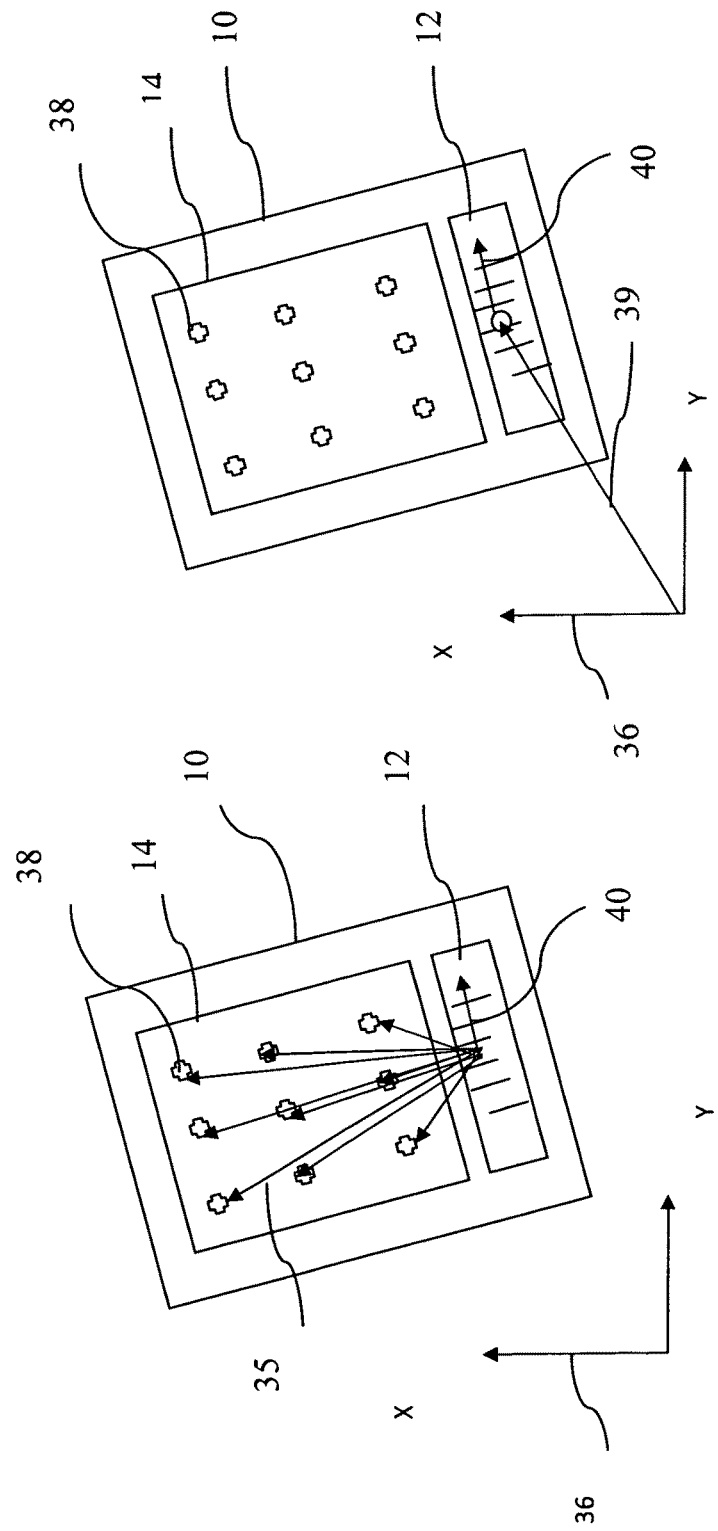
FIGS. 7A and 7B illustrates examples in which a reference board is used as a reference in the alignment of a workpiece.

FIGS. 7A and 7B illustrates examples in which a reference board 12 is used as a reference in the alignment of a workpiece 14. In FIG. 7A-7B, reference features such as alignment marks 38 on the work piece 14 are measured with cameras in the measurement station. In FIG. 7A, the reference features 38 are measured and indicated in relation 38 to the reference board 12 or board reference features of the reference board. In FIG. 7B, the reference board is measured and indicated in relation 39 to a coordinate system of the measurement station or of the write machine.

Example Exposure of Substrate

FIG. 7B The position of the reference board is measured with the exposure light or a system that is calibrated against the exposure beam. FIG. 8 illustrates an example in which the exposure light is used to measure the position of the reference board. The position of the substrate is given relative the position and rotation of the reference board.

Alignment with Calibration in Patterning—Further Embodiments

Figure 12A:
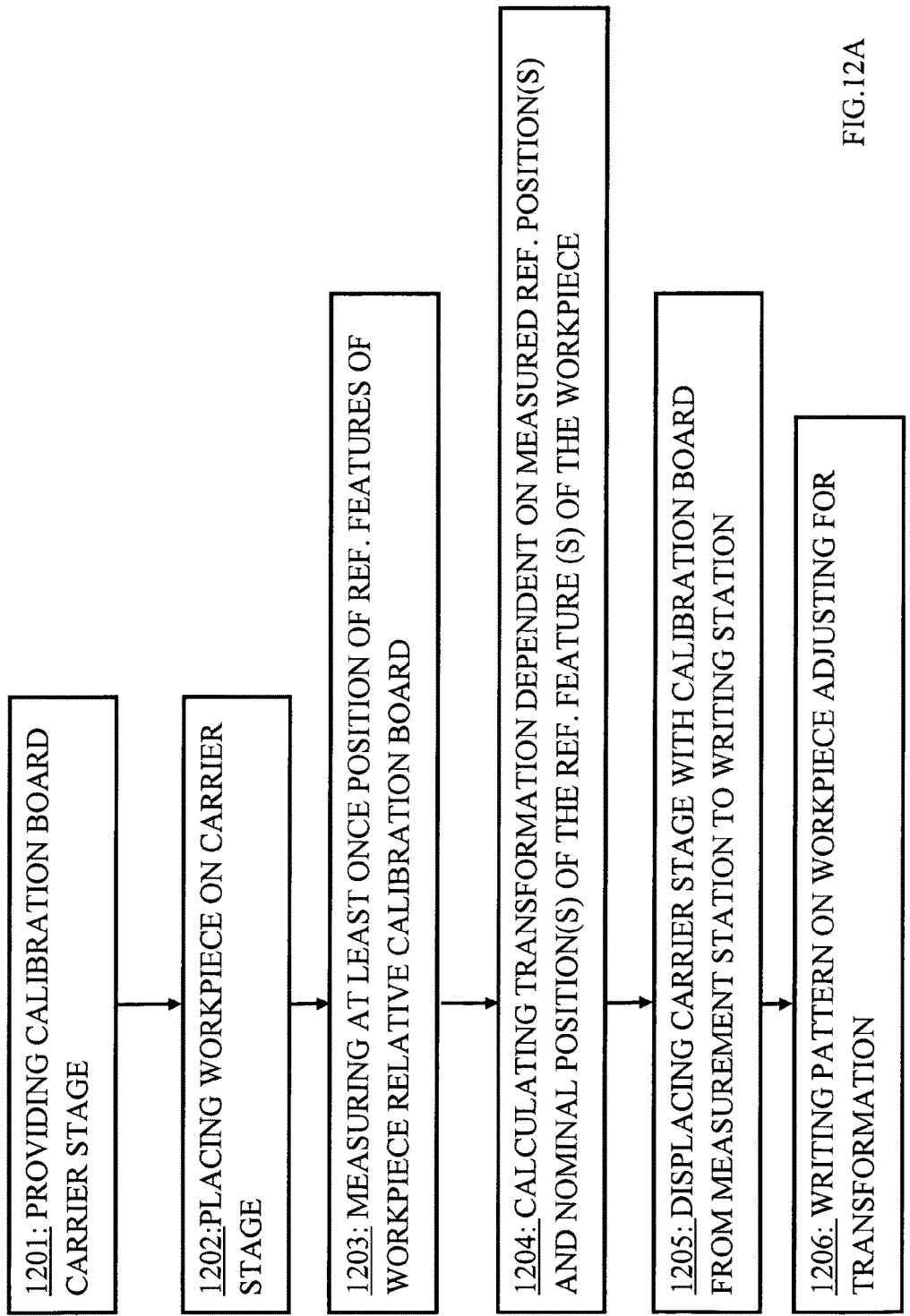
FIG. 12A shows in a schematic flow diagram the method of an embodiment of the invention.
Figure 12:
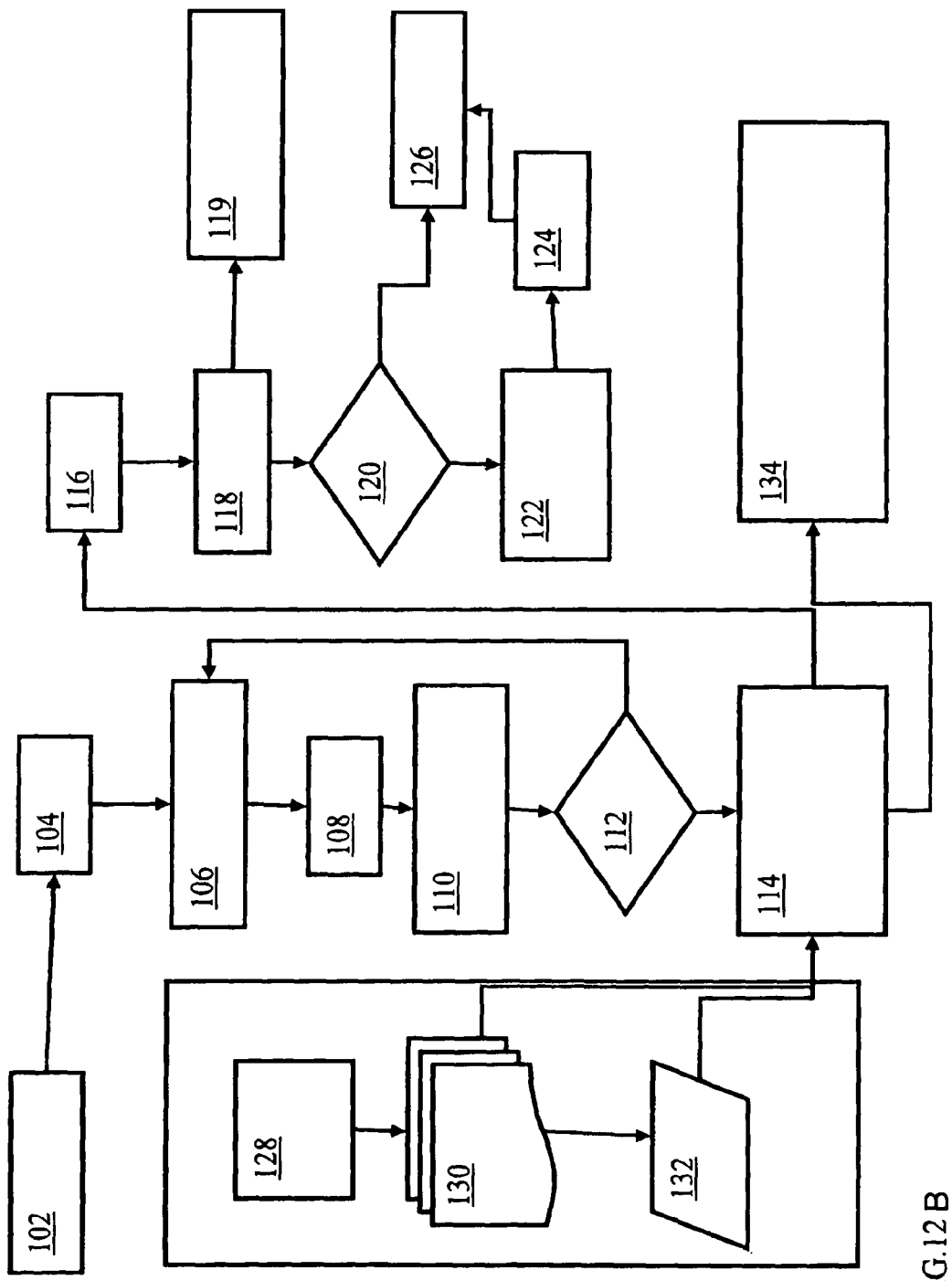
FIG. 12B shows a first example of a general alignments sequence according to an embodiment of the invention.
Figure 13:
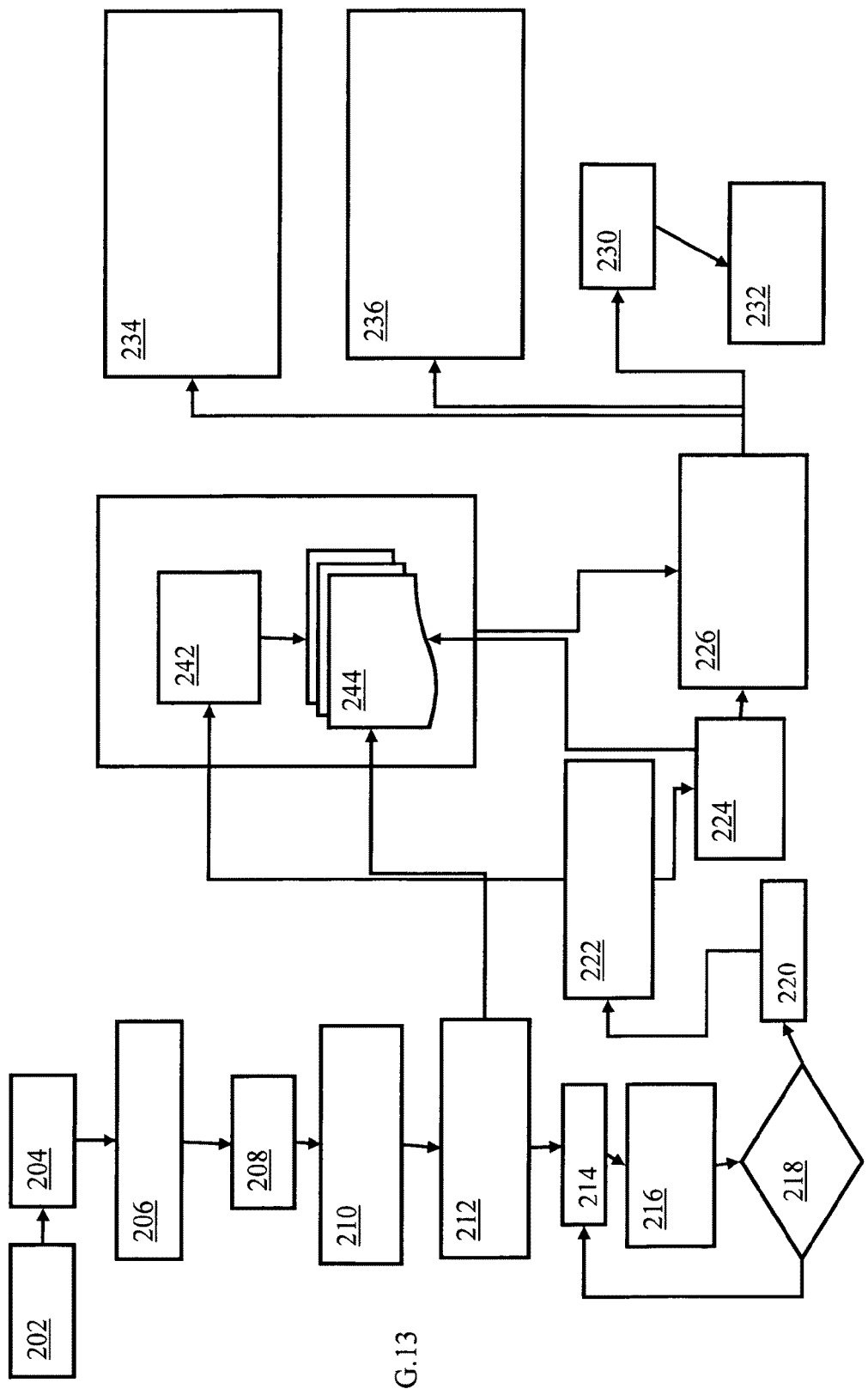
FIG. 13 shows another example of an alignments sequence according to an embodiment of the invention.
Figure 14:
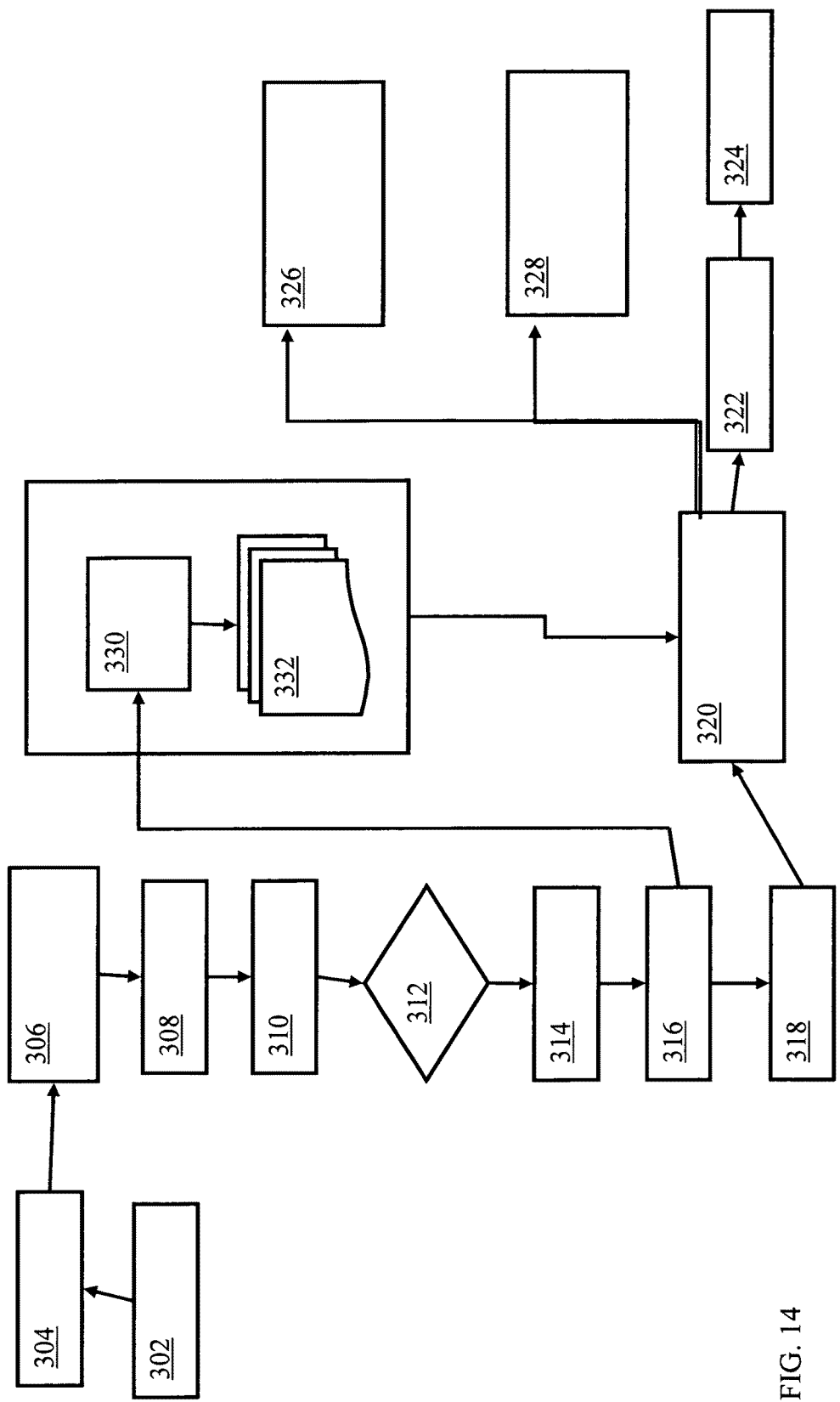
FIG. 14 shows an alternative embodiment of alignment sequence.

FIGS. 12-14 illustrate alignment methods according to example embodiments in more detail.

Embodiments of the inventive concept comprise a selection of the following steps in a method of patterning a layer of a workpiece in a write machine. As in all embodiments, the write machine may be any type of write machine for pattern generation by pattern imaging on a photosensitive surface, for example a direct write machine, a mask writer or a stepper.

The write machine comprises, in this embodiment a pattern writing station provided with a write machine coordinate system and a measurement station provided with a measurement coordinate system. The measurement station is configured to perform measurements of objects on a workpiece provided with or associated with reference features. In operation the workpiece is placed on a carrier stage, and the write machine is configured to displace the carrier stage between the measurement station and the writing station FIG. 12A shows in a schematic flow diagram the method of an embodiment of the invention comprising the steps of 1201. Providing a reference board attached to the carrier stage, the reference board having board reference features on predetermined nominal positions.

1202. Placing a workpiece on the carrier stage.

1203. Measuring at least once, in the measurement station, the position, e.g. location and orientation, of at least one of the reference features of the workpiece relative the reference board.

This step of measuring, in the measurement station, the position of at least one of the reference features of the workpiece relative the reference board may be performed with a selectable frequency. For example, the selectable frequency is a selection of:
in the alignment of each workpiece; or
in the alignment of every n:th workpiece wherein n is a selectable integer; or
in response to a control signal from an operator; or
in response to a detectable deviation from preset alignments requirements; or
dependent on predetermined rules.

1204. Calculating a transformation dependent on both the measured reference position(s) and on the nominal position(s) of the reference feature(s) of the workpiece, the transformation describing the deviation of the measured positions from the nominal position(s).

In one embodiment the step of calculating a transformation comprises the action of calculating adjusted pattern data according to the transformation, and fitting the adjusted pattern data to the position of the workpiece being given relative the position of the reference board. Further, the step of writing the pattern on the workpiece is performed by exposing the work piece according to the adjusted pattern data. Optionally, the calculation of the adjusted pattern data for writing on the work piece is dependent on measured positions of the reference features of the work piece relative a board reference feature of the reference board, and wherein the reference board represents the coordinate system of the carrier stage by having a attached relative distance to the carrier stage.

No compensation is performed by changing the position of the stage or changing the position of the write beam.

1205. Displacing the carrier stage with the reference board from the measurement station to the writing station.

1206. Writing the pattern on the workpiece by adjusting for the transformation describing the deviation of the measured position(s) from the nominal position(s).

Preferably, in the writing station, the position of the reference board is measured with the exposure light or a system that is calibrated against the exposure beam. The position of the work piece is determined (or given) relative the position and rotation of the reference board.

Calibration of Write Station and Measurement Station

Further, the embodiments of the method comprises a selection of optional calibration steps. Firstly, the method may include the step of calibrating the writing station by measuring the position of the reference board using at least one of the board reference features of the reference board.

The calibrating of the measurement station is comprises, in one variation the steps of:

a. determining the scale error and distortion for each camera in the measurement station by measuring the positions of board reference features arranged in a uniform or non uniform grid pattern on the reference board and comparing with nominal positions of the board reference features;

b. calculating a lens distortion map dependent on the measured scale error distortions of the cameras; the map can hold only the non linear scale errors/distortions or also the global linear scale error.

c. calculating the landing angle of the camera by measuring position of reference boards at different height;

d. determining the position of each camera in the measurement station relative the reference board by:
   i. detecting the position of board reference features on the reference board;
   ii. calculating the position of each camera dependent on a predetermined relationship between the position of the board reference features and a reference point on the reference board.

e. calculating the rotation of each camera as the rotation between the pattern and the coordinate system associated with the camera.

Secondly, the method may include the step of calibrating the measurement station to the reference board by measuring, in the measurement station, at least one of the board reference features of the reference board.

Pattern Data Representing Different Kinds of Patterns

The adjusted pattern data optionally comprised in the step of calculating a transformation may represent patterns of different kinds. The pattern may be any type of pattern for pattern generation by pattern imaging on a photosensitive surface, for example:
an electronic circuit pattern on a printed circuit board, or
an electronic circuit pattern for connecting to components e.g. in the form of dies, or a pattern on a workpiece for manufacturing a display, or a pattern on a workpiece for manufacturing a solar cell.

For example, adjusted pattern data represents the circuit pattern of a plurality of dies, or group of dies, already distributed on the workpiece, and wherein the step of calculating a transformation comprises the action of fitting the adjusted pattern data to the plurality of dies, or group of dies. The adjusted pattern data may be fitted individually to the plurality of dies, or group of dies. Alternatively, the plurality of dies, or group of dies, includes all of the dies distributed on the workpiece.

Further, circuit pattern data associated with at least one of the dies, or group of dies, on the workpiece is adjusted individually and independently of circuit pattern data associated with the other dies on the workpiece. In another case, circuit pattern data associated with each of the dies, or group of dies, on the workpiece is adjusted individually and independently of circuit pattern data associated with any of the other dies on the workpiece.

In one embodiment, the positions of the dies, or group of dies, in terms of both location and orientation together with the workpiece location and orientation relative the writer coordinate system is used to determine a transformation of the measured positions defined in the coordinate system of the direct write machine. In another embodiment, the position of the dies, or group of dies, is determined in terms of both the location and the orientation of the dies on the workpiece in relation to at least one of the reference and/or the spatial location and orientation of the dies, or group of dies, in a space comprising the work piece in relation to the reference.

Reference Features of Workpiece

The at least one reference feature of the workpiece is determined by a selection of:
a. one or several alignment mark(s) provided on the work piece; or
b. one or several reference feature(s) provided on one or a plurality of reference die(s) selected among the plurality of dies; or
c. a characteristic of the arrangement of the dies distributed on the work piece; or
d. a characteristic of the surface structure of the work piece; or
e. a characteristic of the surface structure of the die(s); or
f. one or several reference die(s); or
g. a characteristic of the shape of the work piece, such as an edge or a corner of the work piece.

In the case of dies being placed on the workpiece, a reference feature of a die is determined by a selection of:
a. one or several alignment mark(s) provided on the die; or
b. a characteristic of the surface structure of the die(s); or
c. a characteristic of the shape of the die, such as an edge or a corner of the die.

Reference Board on Carrier Stage

Figure 16:
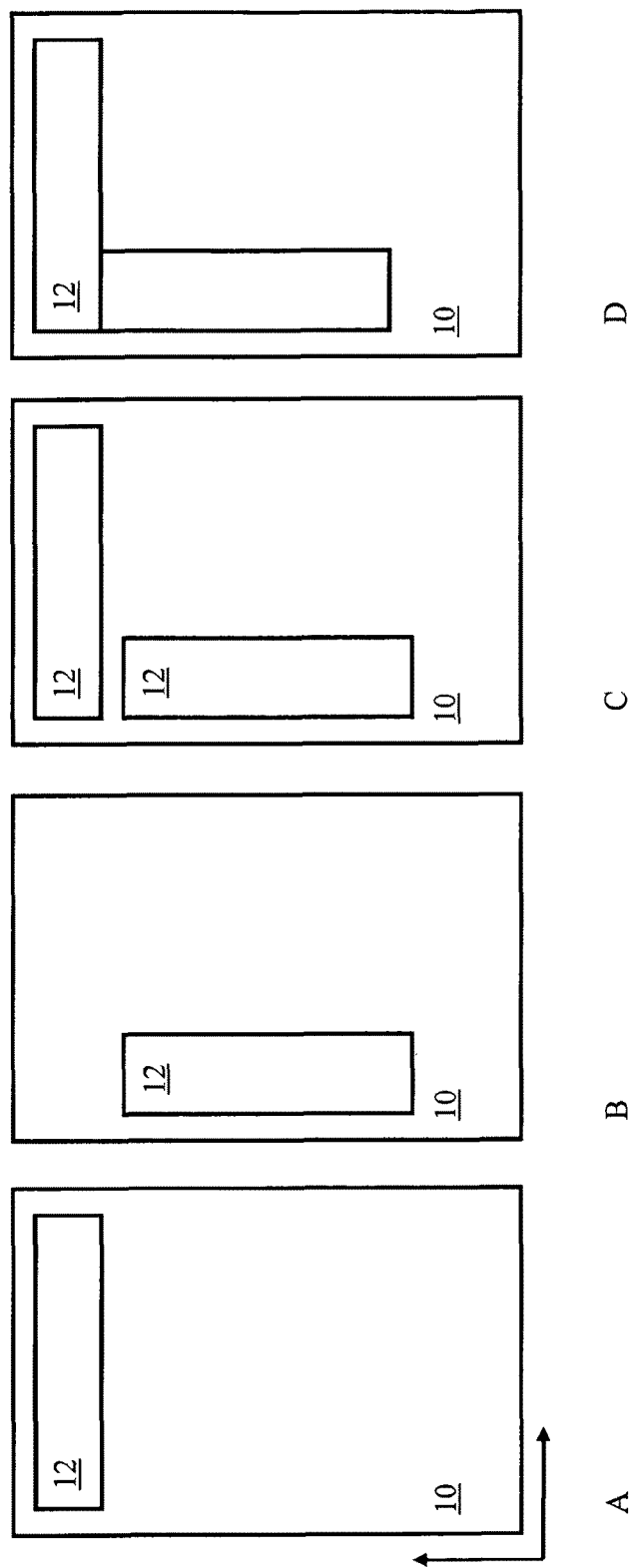
FIG. 16A-16D illustrates examples of different configurations of the reference board.

In the inventive concept, there are different configurations of the reference board 12. FIG. 16 illustrates examples of different configurations. For example, the board 12 may be arranged orthogonally/perpendicular (as in A of FIG. 16) or coaxially/co-linear (as in B of FIG. 16) in relation to the main direction of movement past the measuring station and/or the write station or in relation to the scanning direction of a measurement device or a writer beam. In one configuration, there is a first reference board provided in the orthogonal orientation and a second reference board is provided in the coaxial orientation (as in C of FIG. 16). In one embodiment, the reference board is configured in an L-shape (as in D of FIG. 16), preferably with one leg in the orthogonal orientation and the other leg in the coaxial orientation. Other orientations of the reference board are also conceivable. The reference board and/or the carrier stage may have different shapes, for example rectangular, quadratic, round, ellipse, etc.

System of Apparatus for Patterning

The methods according to the inventive concept are typically applied in a system of apparatus. The system comprises apparatus units including at least one computer system configured to realizing any of the method steps and/or functions described herein inter alia by means of specifically designed computer software program code or specifically designed hardware, or a combination thereof. A computer program product according to the invention comprises computer program code portions configured to control a computer system to perform any of the above described steps and/or functions of the method.

The computer system typically comprises a data preparation unit, a transformation unit and a writing tool control unit, preferably realized as software, and is communicatively coupled to a write machine with a writing station. The write machine is provided with a coordinate system for controlling write operations on a workpiece and a mechanism configured for detecting a reference feature on or associated with the workpiece and/or a board reference feature of the reference board, preferably by means of imaging technology.

Embodiments of the computer system further comprises a unit for determining the relation between on one hand at least one reference feature of the workpiece and/or at least one board reference feature of the reference board and on the other hand the coordinate system of the direct write machine. A data preparation unit also comprised in the computer system is configured to prepare pattern data before and/or after transformation. A transformation unit is in one embodiment configured to transforming the measured position of a plurality of dies to a transformed position defined in the coordinate system of the direct write machine comprised in the write machine dependent on a determined relation between on one hand the at least one reference feature of the workpiece and/or a board reference feature of the reference board and on the other hand the coordinate system of the direct write machine. In one variation the transformation unit comprises a re-sampling unit configured to resample the pattern data. In another variation the transformation unit comprises a rasterizer configured to rasterize the pattern data.

The data preparation unit is in one embodiment configured to preparing adjusted circuit pattern data for writing on the workpiece dependent on both the original pattern data and the transformed positions, wherein the adjusted circuit pattern data represents the circuit pattern of the plurality of dies, or group of dies, such that the adjusted circuit pattern is fitted to a plurality of sub-areas of the workpiece area, and wherein each sub-area is associated with a die, or group of dies, among the plurality of dies distributed on the workpiece. The write machine control unit is configured to control the write machine to writing a pattern on the workpiece according to the adjusted circuit pattern data. Similarly, different embodiments of the units of the apparatus are configured to carry out the various embodiments of the method.

An embodiment of such a system of apparatus for patterning a layer of a workpiece in a write machine, referring to FIG. 1, comprises a write machine (1) having a pattern writing station (2) provided with a write machine coordinate system; and a measurement station (4) provided with a measurement coordinate system. The measurement station is configured to perform measurements of objects on a workpiece (14) provided with or associated with reference features. Further, the system comprises a carrier stage (10) configured for carrying a workpiece (14) placed thereon and being provided with a reference board (12) attached to the carrier stage (10), the reference board (12) having board reference features on predetermined nominal positions. The write machine is configured to displace the carrier stage (10) between the measurement station (4) and the writing station (2). The system further comprises a computer system (6) configured to control:
  i. measuring at least once, in the measurement station, the position, e.g. location and orientation, of at least one of the reference features of the workpiece relative the reference board;
  ii. calculating a transformation dependent on both the measured reference position(s) and on the nominal position(s) of the reference feature(s) of the workpiece, the transformation describing the deviation of the measured positions from the nominal position(s);
  iii. displacing the carrier stage with the reference board from the measurement station to the writing station;
  iv. writing the pattern on the workpiece by adjusting for the transformation describing the deviation of the measured position(s) from the nominal position(s).

Embodiments of the system further comprise functional units and/or mechanisms configured to perform the steps and/or functions of the method according to a selection of the features explained above.

The inventive concept further comprises a carrier stage for use in write machine configured for patterning of a layer of a workpiece, wherein a reference board is attached to the carrier stage, the reference board having board reference features on predetermined nominal positions.

Computer Program Product for Controlling Patterning

The inventive concept further comprises a computer program product for patterning a layer of a workpiece in a write machine in a system as described above. The computer program product comprises computer program code portions configured to control a computer system (6) to perform the steps of:
  i. measuring at least once, in the measurement station, the position, e.g. location and orientation, of at least one of the reference features of the workpiece relative the reference board;
  ii. calculating a transformation dependent on both the measured reference position(s) and on the nominal position(s) of the reference feature(s) of the workpiece, the transformation describing the deviation of the measured positions from the nominal position(s);
  iii. displacing the carrier stage with the reference board from the measurement station to the writing station;
  iv. writing the pattern on the workpiece by adjusting for the transformation describing the deviation of the measured position(s) from the nominal position(s).

Embodiments of a computer program product further comprise computer program code portions configured to control a computer system to perform the steps and/or functions of the method according to a selection of the features explained above.

Movement Schedule in Alignment

Figure 15:
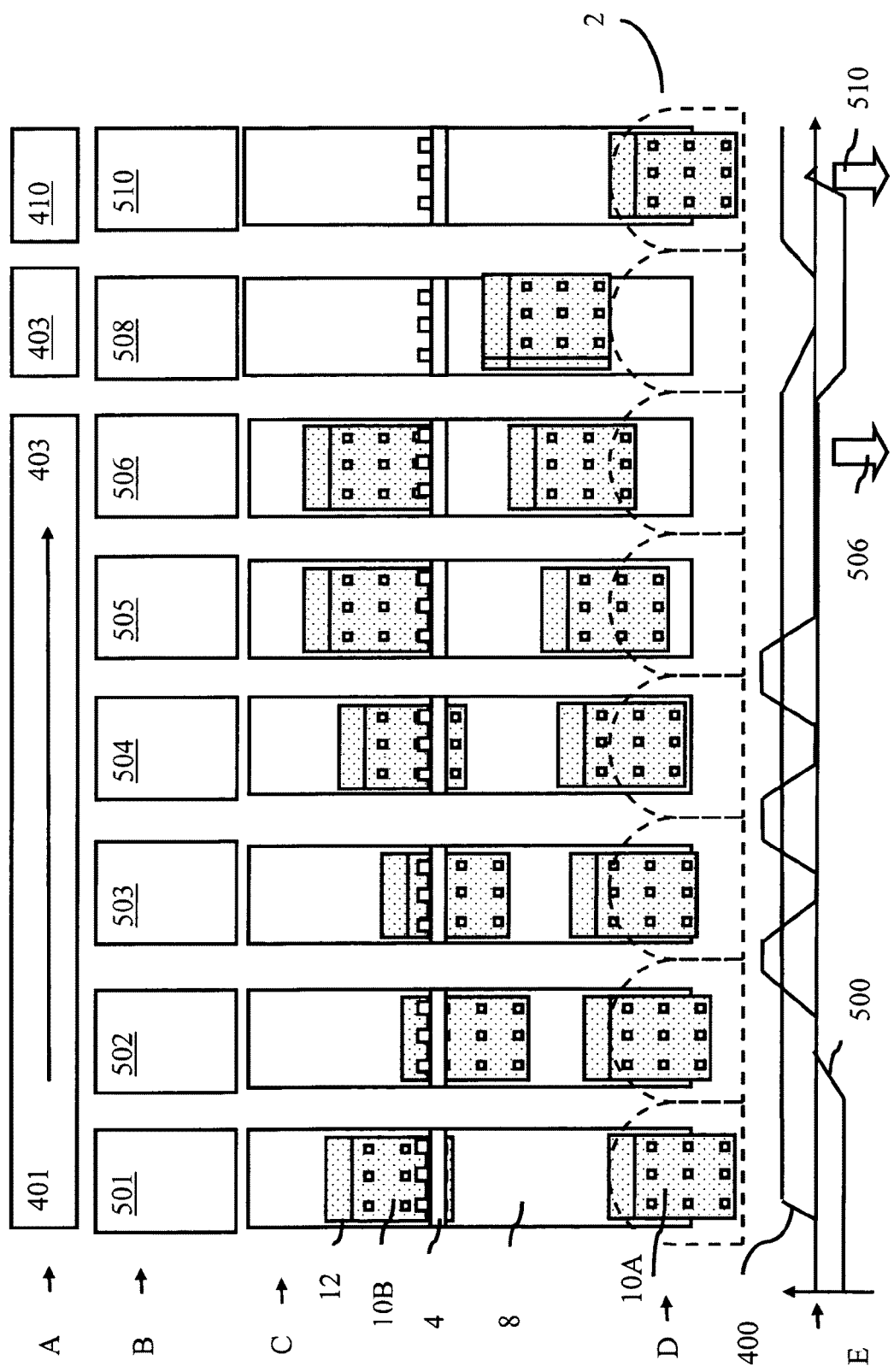
FIG. 15A-15E shows an example of a movement schedule for an embodiment of the invention employing two carrying stages.

FIG. 15 illustrates an example of a movement schedule for an example embodiment including twin stages.

The foregoing description of example embodiments has been provided for purposes of illustration. It is not intended to be exhaustive or limiting. Individual elements or features of a particular example embodiment are generally not limited to that particular embodiment, but where applicable, are interchangeable and can be used in a selected embodiment, even if not specifically shown or described. The same may also be varied in many ways. All such variations and modifications are intended to be included within the scope of attached claims.

Determining a Transformation

The transformation to be applied is determined in a variety of ways, for example dependent on the characteristics of the workpiece and/or the dies distributed thereon.

Figure 8B:
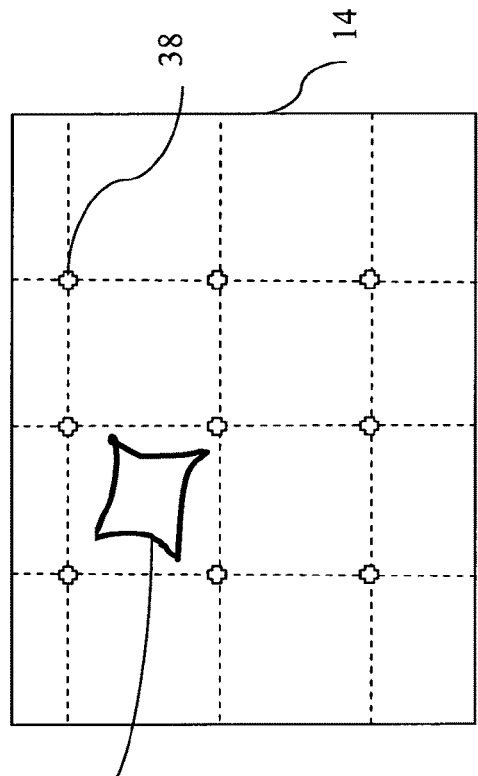
FIG. 8A-8B illustrate examples of how different transformations may fit to reference features 38 on a workpiece.
Figure 8A:
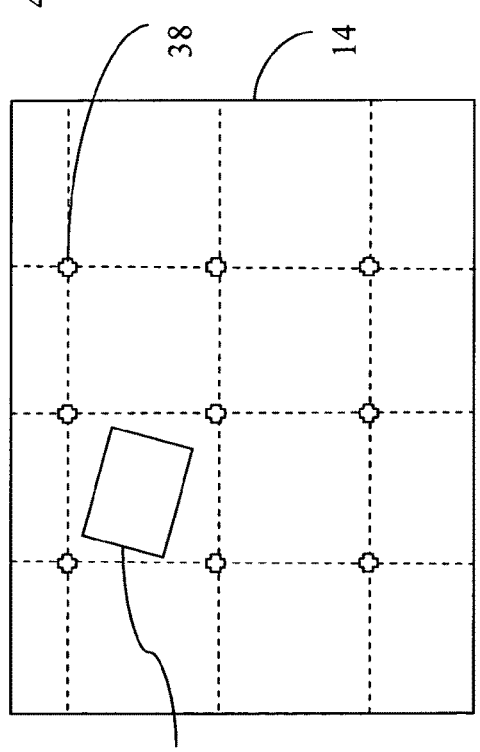

FIG. 8A-8B illustrate examples of how different transformations may fit to reference features 38 of a workpiece 14. In FIG. 8A, a linear transform 42 is shown, and in FIG. 8B a non linear transform is shown for adjustment to reference features 38.

Figure 9B:
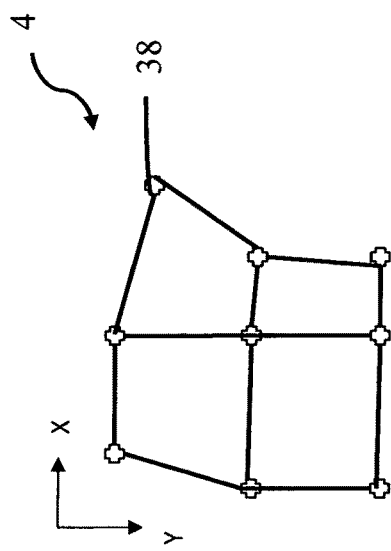
FIG. 9A-9B illustrate an example of measurement results.
Figure 9A:
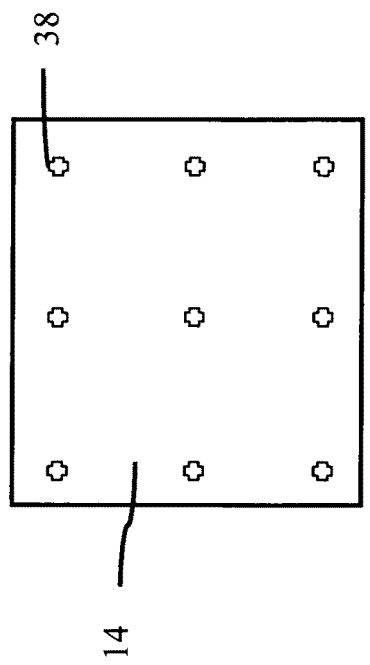

FIG. 9A-9B illustrate an example of measurement results. FIG. 9A shows a workpiece 14 with reference features 38 in nominal positions. In FIG. 9B measurement results showing a distortion map 44 for the actual positions of the reference features 38.

In different embodiments of the invention there are different optional transformations.

The transformation of the pattern data, vector data or coordinate system to fit the spatial positions of the die(s) or groups/clusters of dies could be either linear or non-linear, such as e.g. a spline, polynomial or projective. Similarly, transforming the measured positions to transformed positions of the dies, i.e. single dies or group of dies, comprises a selection of linear or non-linear transformation. Further, the preparation of adjusted circuit pattern data comprises transforming of the pattern data to fit the positions of the dies, or group of dies, may comprise using a selection of linear or non-linear transformation.

Examples of optional, global or local, transformations according to different embodiments comprise a selection or a combination of: scale, rotation, mean only; affine transformation; projective transformation; bilinear interpolation, spline, polynomial.

Figure 10A:
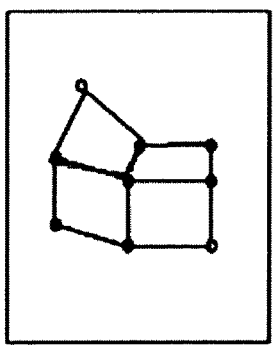
FIG. 10A-10E illustrates a plurality of example transformations.
Figure 10B:
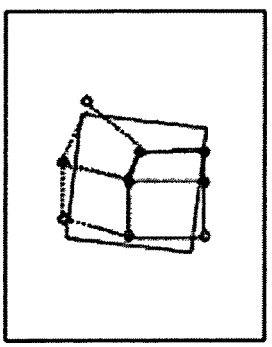
Figure 10C:
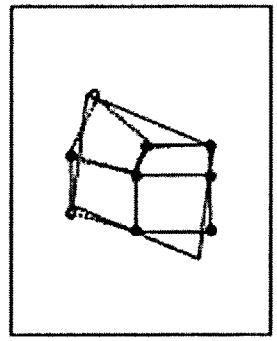
Figure 10D:
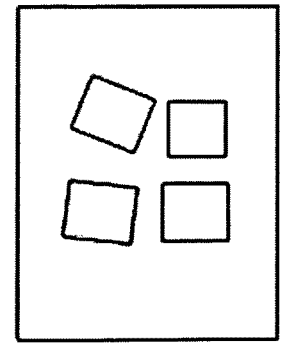
Figure 10E:
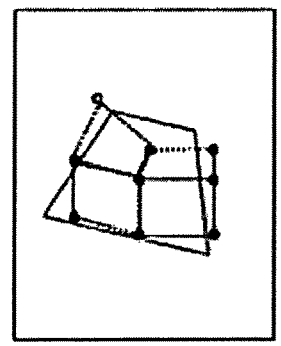

FIG. 10A-10E illustrates a plurality of example transformations. The following transformations are shown, wherein
  FIG. 10A illustrates global scale, rotation, mean only.
  FIG. 10B illustrates global affine transform.
  FIG. 10C illustrates global projective transformation.
  FIG. 10D illustrates in an exploded view local scale, rotation, mean, local affine, local projective.
  FIG. 10E illustrates a transformation in the form of compensation defined as a bilinear interpolation rendering a perfect fit to the measured reference features.

Figure 11B:
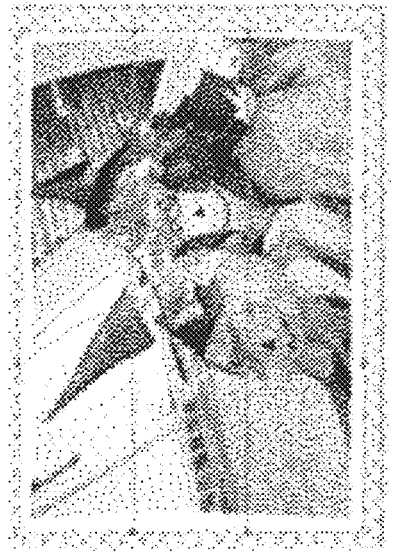
FIG. 11A-11B show an example of a compensating distortion applied to an image.
Figure 11A:
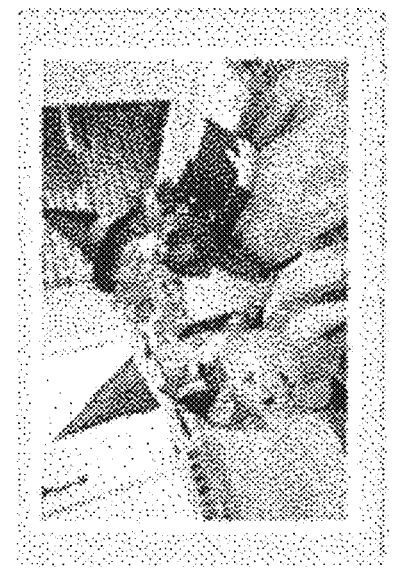

FIG. 11A-11B show an example of a compensating distortion applied to an image. FIG. 11A shows an original image illustrating ideal data for a pattern, and FIG. 11B shows the image distorted by a compensation map illustrating an adjusted pattern that is compensated for deviations of the positions of reference features on or associated with the work piece. Compensation may be performed in the data domain by re-sampling a bitmap based image. As mentioned, no compensation is done by changing the position of the stage or changing the position of the write beam.

Detailed Examples of Alignment Method Sequences

The alignment method may be realized according to different embodiments in which a carrying stage with a reference board and a workpiece provided thereon is moved on a carrier stage track as explained above.

General Alignments Sequence

FIG. 12B shows a first example of a general alignments sequence according to an embodiment of the invention that comprises the following steps.
102: Start alignment.
104: Move the carrying stage with reference board in the measurement station.
106: Measure CCD camera position in relation to the reference board.

108: Move the carrying stage in the in the measurement station.
110: Measure reference features in the form of alignment marks on or associated with the workpiece.
112: Check if all marks are measured:
   If No then return to step 108.
   If Yes then proceed.
114: Calculate alignment distortion map ADM with transformations.
   AND
   134: Distribute alignment distribution map ADM to calculate adjusted image in a compensated or adjusted form dependent on the alignment distortion map.
   Data is received from:
   128: Data file for workpiece thickness.
   130: Data file for lens telecentricity maps.
   132: Data for last exposure light measurement.
116: Move carrying stage to writing station.
118: Measure position of reference board by or dependent on the exposure light in the writing station.
119: Distribute the translation of the position of the carrying stage to place image.
120: Check if deviation is acceptable:
   If No then step 122
   If Yes then step 126
122: Redistribute the alignment distribution map to calculate adjusted image.
124: Wait
126: Start exposure First Workpiece in New Batch Another example of an alignments sequence according to an embodiment of the invention shown in FIG. 13 comprises the following steps. This alignment sequence is suitable for a first workpiece in a batch of workpieces.
202: Start new batch.
204: Move CCD cameras of measurement station.
   Receiving data for board reference feature positions 240 from a GUI or a job file 238.
206: Measure positions of CCD cameras in relation to a first reference board on a first carrying stage.
208: Move carrying stage.
210: Measure positions of CCD cameras in relation to a second reference board on a second carrying stage.
212: Calculate lens telecentricity map.
   Store data in lens telecentricity maps 244.
214: Move carrying stage.
216: Measure reference features in the form of alignment marks on or associated with the workpiece.
218: Check if all reference features are measured
   If No then return to step 214.
   If Yes then proceed to step 220.
220: Move carrying stage.
222: Measure thickness of workpiece.
   Store thickness data in workpiece thickness data file 242.
224: Measure position of exposure light twice.
   Store data in lens telecentricity map 244.
226: Calculate alignment distortion map ADM.
   AND
   234: Distribute alignment distribution map ADM to calculate adjusted image in a compensated or adjusted form dependent on the alignment distortion map.
   AND
   236: Distribute the translation of the position of the carrying stage to place image.
230: Wait
232: Start exposure.

Alternative Embodiment of Alignment Sequence

Another variety of the alignments sequence according to an embodiment of the inventive concept is shown in FIG. 14 and comprises the following steps.
302: Start alignment.
304: Move the carrying stage with reference board in the measurement station.
306: Measure CCD camera position in relation to the reference board.
308: Move the carrying stage in the in the measurement station.
310: Measure reference features in the form of alignment marks on or associated with the workpiece.
312: Check if all marks are measured:
   If No then return to step 308.
   If Yes then proceed.
314: Move carrying stage.
316: Measure thickness of workpiece.
   Store thickness data in workpiece thickness data file 330.
318: Measure position of exposure light twice.
320: Calculate alignment distortion map ADM.
   Receiving data from lens telecentricity map 332.
   AND
   326: Distribute the translation of the position of the carrying stage to place image
   AND
   328: Distribute alignment distribution map ADM to calculate adjusted image in a compensated or adjusted form dependent on the alignment distortion map.
322: Wait
324: Start exposure.

Movement Schedule for Carrying Stage

As explained above the carrying stage is moved between a writing station and a measurement station. FIG. 15 shows an example of a movement schedule for an embodiment of the invention employing two carrying stages. A first carrying stage 10A and a second carrying stage 10B, each being provided with a reference board 12 and each carrying a workpiece, are moved on a carrier stage track 8 between a write station 2 and a measurement station 4.

Starting from above left in the FIG. 15, A indicates the operation on the first carrying stage 10A, B indicates the operation on the second carrying stage 10B, C shows the position of the respective carrying stage in the measurement station 4, D shows the position of the respective carrying stage in the writing station 2, and E shows the movement speed 400 of the first carrying stage 10A and the movement speed 500 of the second carrying stage 10B.

At 401 to 402 the first carrying stage 10A is under exposure in the writing station.

The second carrying stage 10B is under the following operations in measurement station at:
501: Moving to raster position/position for board reference feature.
502: Capturing images of raster/board reference features.
503: Capturing images of alignment marks/reference features of workpiece.
504: Capturing images of alignment marks/reference features of workpiece.
505: Capturing images of alignment marks/reference features of workpiece.
506: Calculating an alignment distribution map ADM for second carrying stage.

At 403 and 508 carrying stages are switched.

At 404 the first carrying stage is unloaded, that is the exposed workpiece is removed, and a new workpiece is loaded.

At 510 the exposure light position is measured against the reference board of the second carrying stage.

Thereafter the movement sequence is repeated from 401, 501 for the workpieces that are currently loaded on the respective workpieces.

Further Embodiments and Use Cases

In one embodiment of the inventive concept, the reference board is used to a perform real time or near real time adjustment during the write process. In such a case the write time is short, and the reference board may in such a case be devised to enable a parallel detection of the reference features of reference board, for example by suitable design and/or placement of the reference features.

The inventive concept has been explained by means of exemplifying embodiments, and may be used in any write machine for patterning any pattern within the scope of the accompanying claims.

The invention claimed is:

1. A method of patterning a layer of a workpiece in a write machine, the write machine including,
   a pattern writing station having a write machine coordinate system, and
   a measurement station having a measurement coordinate system, the measurement station being configured to measure objects on the workpiece associated with reference features of the workpiece, the workpiece being placed on a carrier stage, and the write machine being configured to move the carrier stage between the measurement station and the pattern writing station,
   the method comprising:
   a. providing a reference board attached to the carrier stage, the reference board having board reference features at nominal positions;
   b. measuring at least once, in the measurement station, a position of at least one of the reference features of the workpiece relative the reference board;
   c. calculating a transformation dependent on both the measured position(s) and nominal position(s) of the at least one of the reference feature(s) of the workpiece, the transformation describing a deviation of the measured position(s) from the nominal position(s);
   c1. compensating for misalignment of a pattern on the workpiece by adjusting pattern data for writing the pattern on the workpiece according to the transformation;
   d. moving the carrier stage with the reference board from the measurement station to the pattern writing station; and
   e. writing the pattern on the workpiece according to the adjusted pattern data.

2. The method of claim 1, wherein the calculating the transformation comprises:
   calculating adjusted pattern data according to the transformation; and
   fitting the adjusted pattern data to a position of the workpiece being given relative to a position of the reference board; wherein
   the pattern is written on the workpiece by exposing the workpiece according to the adjusted pattern data.

3. The method of claim 2, wherein the calculation of the adjusted pattern data for writing on the workpiece is dependent on the measured position(s) of the at least one of the reference features of the workpiece relative to a board reference feature of the reference board, and wherein the reference board represents a coordinate system of the carrier stage having an attached relative distance to the carrier stage.

4. The method of claim 2, wherein the adjusted pattern data represents a circuit pattern of a plurality of dies or group of dies distributed on the workpiece, and wherein the calculating the transformation includes,
   fitting the adjusted pattern data to the plurality of dies or group of dies.

5. The method of claim 4, wherein the adjusted pattern data is fitted individually to the plurality of dies or group of dies.

6. The method of claim 4, wherein the plurality of dies or group of dies includes all dies distributed on the workpiece.

7. The method of claim 4, wherein circuit pattern data associated with at least one of the dies or group of dies on the workpiece is adjusted individually and independently of circuit pattern data associated with other dies on the workpiece.

8. The method of claim 7, wherein a location and orientation of the dies or group of dies on the workpiece is determined in relation to at least one of a reference and a spatial location and orientation of the dies or group of dies in a space including the workpiece in relation to the reference.

9. The method of claim 4, wherein circuit pattern data associated with each of the dies or group of dies on the workpiece is adjusted individually and independently of circuit pattern data associated with any other dies on the workpiece.

10. The method of claim 4, wherein a location and orientation of the dies or group of dies together with a workpiece location and orientation relative to the writer coordinate system is used to determine a transformation of measured positions defined in the coordinate system of the direct write machine.

11. The method of claim 1, further comprising:
   calibrating the writing station by measuring a position of the reference board using at least one of the board reference features of the reference board.

12. The method of claim 1, further comprising:
   calibrating the measurement station to the reference board by measuring, in the measurement station, at least one of the board reference features of the reference board.

13. The method of claim 12, wherein the calibrating the measurement station comprises:
   a. determining a scale error and distortion for each camera in the measurement station by measuring the positions of board reference features arranged in a uniform or non-uniform grid pattern on the reference board, and comparing the measured positions with the nominal positions of the board reference features;
   b. calculating a lens distortion map dependent on the measured scale error and distortion of the cameras, the lens distortion map holding at least the non-linear scale errors and distortions;
   c. calculating a landing angle of the camera by measuring positions of reference board at different heights;
   d. determining a position of each camera in the measurement station relative to the reference board by,
      i. detecting the positions of the board reference features on the reference board, and
      ii. calculating the position of each camera dependent on a relationship between the position of the board reference features and a reference point on the reference board; and
   e. calculating the rotation of each camera as a rotation between the pattern and a coordinate system associated with the camera.

14. The method of claim 1, wherein the measuring the position of the at least one of the reference features of the workpiece relative to the reference board is performed with a selectable frequency.

15. The method of claim 14, wherein the selectable frequency for measuring the position of the at least one of the reference features of the workpiece is one of:
in alignment of each workpiece;
in alignment of every n-th workpiece, n being a selectable integer;
in response to a control signal from an operator;
in response to a detectable deviation from alignment requirements; and
dependent on rules.

16. The method of claim 1, wherein the at least one of the reference features of the workpiece is determined by selection of one of:
a. one or several alignment mark(s) on the workpiece;
b. one or several reference feature(s) on one or a plurality of reference die(s) selected among a plurality of dies;
c. a characteristic of an arrangement of dies distributed on the workpiece;
d. a characteristic of a surface structure of the workpiece;
e. a characteristic of a surface structure of the die(s);
f. one or several reference die(s); and
g. a characteristic of a shape of the workpiece.

17. The method of claim 16, wherein a reference feature of a die is determined by selection of one of:
a. one or several alignment mark(s) provided on the die;
b. the characteristic of the surface structure of the die(s); and
c. the characteristic of the shape of the die.

18. The method of claim 1, wherein the write machine is a direct write machine, a mask writer or a stepper.

19. The method of claim 1, wherein the pattern is one of:
an electronic circuit pattern on a printed circuit board;
an electronic circuit pattern for connecting to components;
a pattern on a workpiece for manufacturing a display; and
a pattern on a workpiece for manufacturing a solar cell.

20. The method of claim 1, wherein the position includes a location and orientation of the at least one of the reference features of the workpiece relative the reference board.

21. A system for patterning a layer of a workpiece, the system comprising:
a. a write machine including,
i. a pattern writing station having a write machine coordinate system, and
ii. a measurement station having a measurement coordinate system, the measurement station being configured to measure objects on the workpiece associated with reference features of the workpiece;
b. a carrier stage configured to carry the workpiece, and having a reference board attached to the carrier stage, the reference board having board reference features at nominal positions on the reference board; and
c. a computer system configured to control,
i. measuring at least once, in the measurement station, a position of at least one of the reference features of the workpiece relative to the reference board,
ii. calculating a transformation dependent on both the measured position(s) and nominal position(s) of the reference feature(s) of the workpiece, the transformation describing a deviation of the measured positions from the nominal position(s) of the reference features of the workpiece,
iii. compensating for misalignment of a pattern on the workpiece by adjusting pattern data for writing the pattern on the workpiece according to the transformation;
iv. moving the carrier stage with the reference board from the measurement station to the writing station, and
v. writing the pattern on the workpiece according to the adjusted pattern data,
wherein the write machine is configured to move the carrier stage between the measurement station and the pattern writing station.

22. The system of claim 21, wherein the position includes a location and orientation of the at least one of the reference features of the workpiece relative the reference board.

23. A carrier stage for use in a write machine configured to pattern a layer of a workpiece having reference features, the carrier stage comprising:
a reference board attached to the carrier stage, the reference board having board reference features at nominal positions; wherein
the reference board is configured so that a position of at least one of the reference features of the workpiece arranged on the carrier stage can be measured relative to the board reference features of the reference board,
misalignment of a pattern on the workpiece can be compensated for by adjusting pattern data for writing the pattern on the workpiece according to a transformation,
the transformation is calculated based on a measured position of the at least one of the reference features of the workpiece and a nominal position of the at least one of the reference features of the workpiece, and
the transformation describes a deviation of the measured position from the nominal position of the at least one of the reference features of the workpiece.

24. The carrier stage of claim 23, wherein at least one of the reference features and the reference board are oriented on the carrier stage at least one of:
orthogonally in relation to main movement direction of the reference board; and
coaxially in relation to main movement direction of the reference board.

25. The carrier stage of claim 23, wherein the at least one of the reference board and the reference features of the workpiece are configured one of:
in an elongate shape; and
in an L-shape.

26. The carrier stage of claim 23, wherein the reference board is attached to the carrier stage by one of:
a screw or bolt joint; and
a glue joint.

27. The carrier stage of claim 23, wherein the reference board is comprised of a temperature stable material.

28. A non-transitory computer-readable storage medium storing computer executable instructions that, when executed, cause a computer system to control a system for patterning a layer of a workpiece, the system including,
a. a write machine having,
i. a pattern writing station with a write machine coordinate system, and
ii. a measurement station with a measurement coordinate system, the measurement station being configured to measure objects on the workpiece associated with reference features of the workpiece,
b. a carrier stage configured to carry the workpiece, and having a reference board attached to the carrier stage, the reference board having board reference features at nominal positions, wherein the write machine is configured to move the carrier stage between the measurement station and the writing station, and wherein the computer executable instructions, when executed, control the computer system to perform a method comprising:
  i. measuring at least once, in the measurement station, a position of at least one of the reference features of the workpiece relative the reference board;
  ii. calculating a transformation dependent on both the measured position(s) and nominal position(s) of the reference feature(s) of the workpiece, the transformation describing the deviation of the measured position(s) from the nominal position(s) of the reference features of the workpiece;
  iii. compensating for misalignment of a pattern on the workpiece by adjusting pattern data for writing the pattern on the workpiece according to the transformation;
  iv. moving the carrier stage with the reference board from the measurement station to the pattern writing station; and
  v. writing the pattern on the workpiece according to the adjusted pattern data.

29. The non-transitory computer-readable storage medium of claim 28, wherein the position includes a location and orientation of the at least one of the reference features of the workpiece relative the reference board.

* * * * *